(12) United States Patent
Yun et al.

(10) Patent No.: US 11,121,157 B2
(45) Date of Patent: Sep. 14, 2021

(54) IMAGE SENSORS

(71) Applicant: Samsung Electronics Co., Ltd., Suwon-si (KR)

(72) Inventors: Jung Bin Yun, Hwaseong-si (KR); Eun Sub Shim, Hwaseong-si (KR); Kyung Ho Lee, Suwon-si (KR); Sung Ho Choi, Seoul (KR); Jung Hoon Park, Hwaseong-si (KR); Jung Wook Lim, Gunpo-si (KR); Min Ji Jung, Daegu (KR)

(73) Assignee: Samsung Electronics Co., Ltd.

( * ) Notice: Subject to any disclaimer, the term of this patent is extended or adjusted under 35 U.S.C. 154(b) by 117 days.

(21) Appl. No.: 16/711,987

(22) Filed: Dec. 12, 2019

(65) Prior Publication Data

US 2020/0119064 A1 Apr. 16, 2020

Related U.S. Application Data

(63) Continuation of application No. 15/862,013, filed on Jan. 4, 2018, now Pat. No. 10,573,676.

(30) Foreign Application Priority Data

Apr. 7, 2017 (KR) ........................ 10-2017-0045155

(51) Int. Cl.
*H01L 27/146* (2006.01)
*H04N 5/378* (2011.01)
(Continued)

(52) U.S. Cl.
CPC .. *H01L 27/14605* (2013.01); *H01L 27/14627* (2013.01); *H01L 27/14641* (2013.01); *H04N 5/369* (2013.01); *H04N 5/37457* (2013.01)

(58) Field of Classification Search
CPC ..................................................... H04N 5/369
See application file for complete search history.

(56) References Cited

U.S. PATENT DOCUMENTS 7,427,790 B2  9/2008 Parks
7,525,077 B2  4/2009 Kim et al.
(Continued)

FOREIGN PATENT DOCUMENTS

JP  2011182321  9/2011
JP  2016005068  1/2016
KR   1340839  11/2013

*Primary Examiner* — Omar F Mojaddedi
(74) *Attorney, Agent, or Firm* — Myers Bigel, P.A.

(57) ABSTRACT

Image sensors are provided. The image sensors may include a substrate including first, second, third and fourth regions, a first photoelectric conversion element in the first region, a second photoelectric conversion element in the second region, a third photoelectric conversion element in the third region, a fourth photoelectric conversion element in the fourth region, a first microlens at least partially overlapping both the first and second photoelectric conversion elements, and a second microlens at least partially overlapping both the third and fourth photoelectric conversion elements. The image sensors may also include a floating diffusion region and first, second and third pixel transistors configured to perform different functions from each other. Each of the first, second and third pixel transistors may be disposed in at least one of first, second, third and fourth pixel regions. The first pixel transistor may include multiple first pixel transistors.

20 Claims, 38 Drawing Sheets

(51) Int. Cl.
    *H04N 5/374*     (2011.01)
    *H04N 5/357*     (2011.01)
    *H04N 5/3745*     (2011.01)
    *H04N 5/369*     (2011.01)

(56) References Cited

U.S. PATENT DOCUMENTS

| | | |
|---|---|---|
| 7,859,582 B2 | 12/2010 | Gomi |
| 9,232,161 B2 | 1/2016 | Suh et al. |
| 9,264,637 B2 | 2/2016 | Sugawa et al. |
| 2007/0164332 A1* | 7/2007 | Paik ................. H01L 27/14641 |
| | | 257/292 |
| 2008/0315337 A1 | 12/2008 | Hasegawa |
| 2013/0188085 A1 | 7/2013 | Shim et al. |
| 2015/0009376 A1* | 1/2015 | Tsunai ................ H01L 27/1464 |
| | | 348/300 |
| 2015/0281614 A1* | 10/2015 | Yoshida ............... H04N 5/3745 |
| | | 348/308 |
| 2015/0381918 A1 | 12/2015 | Mabuchi |
| 2016/0219237 A1* | 7/2016 | Kobayashi ............. H04N 5/378 |
| 2017/0201705 A1* | 7/2017 | Ishiwata ........... H01L 27/14603 |
| 2018/0255261 A1* | 9/2018 | Ishiwata ........... H01L 27/14612 |

\* cited by examiner

IMAGE SENSORS

CROSS-REFERENCE TO RELATED APPLICATION

This application is a continuation of U.S. patent application Ser. No. 15/862,013, filed Jan. 4, 2018, which claims priority under 35 U.S.C. § 119 to Korean Patent Application No. 10-2017-0045155 filed on Apr. 7, 2017 in the Korean Intellectual Property Office, the disclosure of which is hereby incorporated by reference in its entirety.

BACKGROUND

The present inventive concept generally relates to the field of electronics and, more particularly, an image sensor.

An image sensor is a sensor that converts an optical image into an electric signal. Recently, with the development of the computer industry and the communication industry, there has been an increasing demand for an image sensor with improved performance in various fields such as a digital camera, a camcorder, a personal communication system (PCS), a game device, a security camera and a medical micro camera.

The image sensor may be classified into, for example, a charge coupled device (CCD) image sensor and a CMOS image sensor. In the CMOS image sensor, a simple driving scheme may be used, and signal processing circuits may be integrated into a single chip, thereby realizing miniaturization of a product. Also, the CMOS image sensor may have very low power consumption, and thus, may be easily applied to a product with limited battery capacity. In addition, the manufacturing cost may be reduced by using compatible CMOS process technology. Therefore, the CMOS image sensor is rapidly increasing in use as high resolution may be realized along with technology development.

As semiconductor devices have become highly integrated, image sensors have also become highly integrated. Accordingly, a sharing structure that may include a plurality of pixels constituting one unit pixel and one unit pixel sharing pixel transistors may be beneficial.

SUMMARY

Aspects of the present inventive concept may provide an image sensor capable of increasing the integration density by providing various pixel sharing structures.

Aspects of the present inventive concept also may provide an image sensor capable of improving the performance of the image sensor by providing plural transistors for at least one pixel transistor.

However, aspects of the present inventive concept are not restricted to the one set forth herein. The above and other aspects of the present inventive concept will become more apparent to one of ordinary skill in the art to which the present inventive concept belongs by referencing the detailed description provided below.

According to some embodiments of the present inventive concept, image sensors are provided. The image sensors may include a substrate including a first region, a second region disposed adjacent to the first region in a first direction, a third region disposed adjacent to the first region in a second direction that intersects the first direction, and a fourth region disposed adjacent to the second region in the second direction and disposed adjacent to the third region in the first direction, a first microlens disposed to overlap the first and second regions in a plan view, a first photoelectric conversion element disposed in a first pixel region of the first region and a second photoelectric conversion element disposed in a second pixel region of the second region. The first microlens may at least partially overlap both the first photoelectric conversion element and the second photoelectric conversion element in the plan view. The image sensors may also include a second microlens disposed to overlap the third and fourth regions in the plan view, a third photoelectric conversion element disposed in a third pixel region of the third region and a fourth photoelectric conversion element disposed in a fourth pixel region of the fourth region. The second microlens may at least partially overlap both the third photoelectric conversion element and the fourth photoelectric conversion element in the plan view. The image sensors may further include first, second, third and fourth transfer gates configured to control transfer of first, second, third and fourth signals provided by the first, second, third and fourth photoelectric conversion elements, respectively, a floating diffusion region configured to receive any one of the first, second, third and fourth signals and first, second and third pixel transistors configured to perform different functions from each other. Each of the first, second and third pixel transistors may be disposed in at least one of first, second, third and fourth pixel regions, the first, second, third and fourth pixel regions may be disposed in the first, second, third and fourth regions, respectively, and the first, second, third and fourth pixel regions may be different from the first, second, third and fourth pixel regions, respectively. The first pixel transistor may include a plurality of first pixel transistors According to some embodiments of the present inventive concept, image sensors are provided. The image sensors may include a substrate including a first region, a second region disposed adjacent to the first region in a first direction, a third region disposed adjacent to the second region in the first direction, and a fourth region disposed adjacent to the third region in the first direction, a first microlens disposed to overlap the first and second regions in a plan view, a first photoelectric conversion element disposed in a first pixel region of the first region and a second photoelectric conversion element disposed in a second pixel region of the second region. The first microlens may at least partially overlap both the first photoelectric conversion element and the second photoelectric conversion element in the plan view. The image sensors may also include a second microlens disposed to overlap the third and fourth regions in the plan view, a third photoelectric conversion element disposed in a third pixel region of the third region and a fourth photoelectric conversion element disposed in a fourth pixel region of the fourth region. The second microlens may at least partially overlap both the third photoelectric conversion element and the fourth photoelectric conversion element in the plan view. The image sensors may further include first, second, third and fourth transfer gates configured to control transfer of first, second, third and fourth signals provided by the first, second, third and fourth photoelectric conversion elements, respectively, a floating diffusion region configured to receive any one of the first to fourth signals, and first, second and third pixel transistors configured to perform different functions from each other. Each of the first, second and third pixel transistors may be disposed in least one of first, second, third and fourth pixel regions, the first, second, third and fourth pixel regions may be disposed in the first, second, third and fourth regions, respectively, and the first, second, third and fourth pixel regions may be different from the first, second, third and fourth pixel regions, respectively. The first pixel transistor may include a plurality of first pixel transistors.

According to some embodiments of the present inventive concept, image sensors are provided. The image sensors may include a substrate including a first photoelectric conversion element, a second photoelectric conversion element, a third photoelectric conversion element, and a fourth photoelectric conversion element, a first microlens at least partially overlapping both the first photoelectric conversion element and the second photoelectric conversion element in a plan view, a second microlens at least partially overlapping both the third photoelectric conversion element and the fourth photoelectric conversion element in the plan view and a floating diffusion region. The image sensors may also include a first transfer gate configured to control transfer of charges generated in the first photoelectric conversion element to the floating diffusion region, a second transfer gate configured to control transfer of charges generated in the second photoelectric conversion element to the floating diffusion region, a third transfer gate configured to control transfer of charges generated in the third photoelectric conversion element to the floating diffusion region, a fourth transfer gate configured to control transfer of charges generated in the fourth photoelectric conversion element to the floating diffusion region, a reset transistor and a driving transistor connected to the floating diffusion region, and a selection transistor connected to the driving transistor. One of the reset transistor, the driving transistor, and the selection transistor may include a plurality of transistors.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

Hereinafter, an image sensor according to some embodiments of the present inventive concept will be described with reference to FIGS. 1 and 2.

Figure 1:
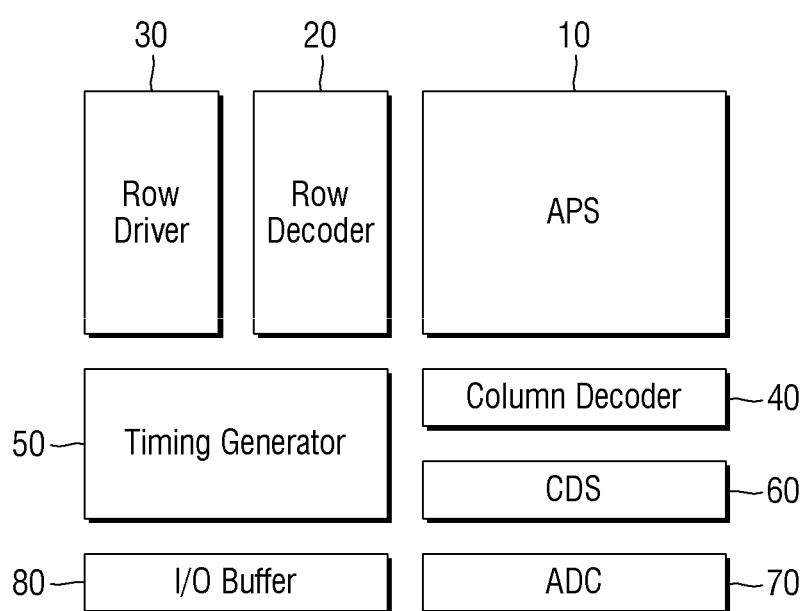
FIG. 1 is a block diagram of an image sensor according to some embodiments of the present inventive concept.

Referring to FIG. 1, an image sensor according to some embodiments includes an active pixel sensor array 10, a row decoder 20, a row driver 30, a column decoder 40, a timing generator 50, a correlated double sampler (CDS) 60, an analog to digital converter (ADC) 70, and an input/output buffer (I/O buffer) 80.

The active pixel sensor array 10 includes a plurality of unit pixels arranged two-dimensionally, and may convert an optical signal into an electrical signal. The active pixel sensor array 10 may be driven by a plurality of driving signals such as a pixel selection signal, a reset signal and a charge transfer signal received from the row driver 30. The electrical signal converted by the active pixel sensor array 10 may also be provided to the correlated double sampler 60.

The row driver 30 may provide a plurality of driving signals to driving the plurality of unit pixels of the active pixel sensor array 10 according to the decoding result of the row decoder 20. When the unit pixels are arranged in a matrix form, driving signals may be provided for each row. The timing generator 50 may provide a timing signal and a control signal to the row decoder 20 and the column decoder 40. The correlated double sampler (CDS) 60 may receive, hold and sample the electrical signal generated by the active pixel sensor array 10. The correlated double sampler 60 may doubly sample a specific noise level and a signal level of the electrical signal to output a difference level corresponding to a difference between the noise level and the signal level. The analog to digital converter (ADC) 70 may convert an analog signal corresponding to the difference level outputted from the correlated double sampler 60 into a digital signal and output the digital signal. The input/output buffer 80 may latch the digital signal, and output the latched signal as a digital signal to an image signal processor (not shown) sequentially according to the decoding result of the column decoder 40.

Figure 2:
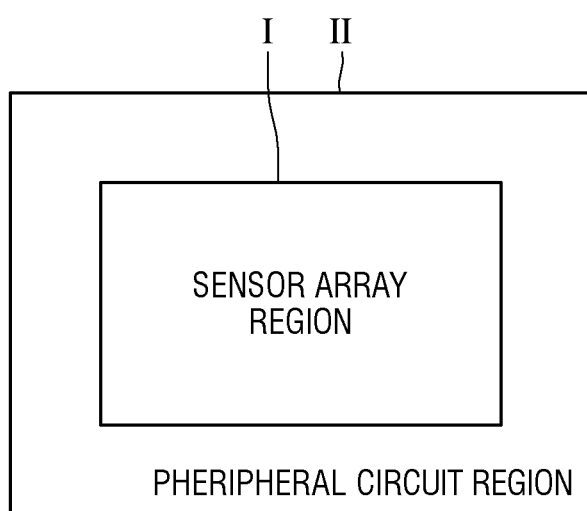
FIG. 2 is a conceptual diagram illustrating an image sensor according to some embodiments of the present inventive concept.
Figure 2:
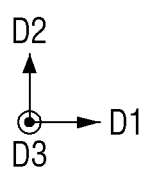

Referring to FIG. 2, for example, a peripheral circuit region II may be a region where the correlated double sampler 60, the analog to digital converter 70 and the like of FIG. 1 may be formed. A sensor array region I may be, for example, a region where the active pixel sensor array 10 of FIG. 1 is formed. In some embodiments, the peripheral circuit region II may be formed so as to surround the sensor array region I as illustrated in FIG. 2, but the present inventive concept is not limited thereto.

Hereinafter, an image sensor according to some embodiments of the present inventive concept will be described with reference to FIG. 1 through FIG. 9. For brevity and clarity of explanation, repeated descriptions may be omitted.

FIGS. 3, 4, 5 and 6 are views showing one unit pixel of the sensor array region I of FIG. 2.

Figure 3:
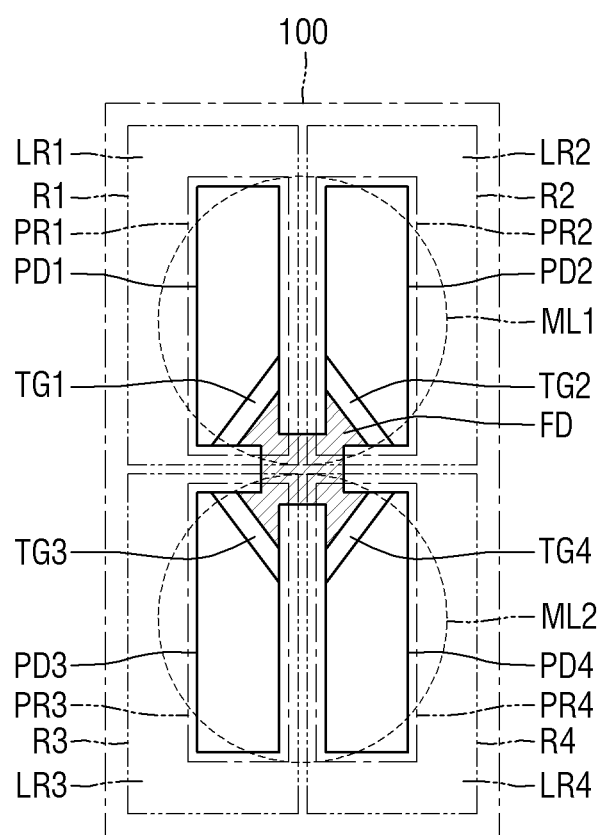
FIG. 3 is an example layout diagram illustrating an image sensor according to some embodiments of the present inventive concept.

Referring to FIGS. 2 and 3, the image sensor according to some embodiments of the present inventive concept may include a unit pixel including first, second, third and to fourth regions R1, R2, R3 and R4 disposed in the substrate 100. A plurality of unit pixels, each of which may include the first, second, third and to fourth regions R1, R2, R3 and R4 of FIG. 3, may be arranged in the sensor array region I of FIG. 2. In some embodiments, the plurality of unit pixels may be repeatedly arranged along a first direction D1 and a second direction D2 in the sensor array region I of FIG. 2. The second direction D2 may traverse the first direction D1. In some embodiments, the second direction may be substantially perpendicular to the first direction D1. Here, the unit pixel may include first, second and third pixel transistors, which will be described later, shared by the first through fourth regions R1 through R4. In some embodiments, the first direction D1 and the second direction D2 are horizontal directions substantially parallel to a surface of the substrate.

In some embodiments, the first to fourth regions R1 to R4 of the unit pixel may be arranged as illustrated in FIG. 3. Specifically, the second region R2 may be disposed adjacent to the first region R1 in the first direction D1. The third region R3 may be disposed adjacent to the first region R1 in the second direction D2. The fourth region R4 may be disposed adjacent to the third region R3 in the first direction D1 and may be disposed adjacent to the second region R2 in the second direction D2.

Still referring to FIG. 3, in some embodiments, a first microlens ML1 may be disposed to overlap both the first region R1 and the second region R2 in a plan view and may be spaced apart from both the first region R1 and the second region R2 in a third direction D3. The third direction D3 may be a vertical direction and may be substantially perpendicular to both the first direction D1 and the second direction D2. In other words, the first region R1 and the second region R2 may share the single microlens (i.e., first microlens ML1). The first micro lens ML1 may provide light to a first photoelectric conversion element PD1 and a second photoelectric conversion element PD2.

A second microlens ML2 may be disposed to overlap both the third region R3 and the fourth region R4 in the plan view and may be spaced apart from both the third region R3 and the fourth region R4 in the third direction D3. In other words, the third region R3 and the fourth region R4 may share the single microlens (i.e., second microlens ML2). The second microlens ML2 may provide light to a third photoelectric conversion element PD3 and a fourth photoelectric conversion element PD4.

The first region R1 may include a first pixel region PR1 and a first pixel region LR1. In some embodiments, the first pixel region PR1 and the first pixel region LR1 may be different each other and thus may not be overlap each other as illustrated in FIG. 3. The first pixel region PR1 may include the first photoelectric conversion element PD1 and a first transfer gate TG1. In the first pixel region LR1, at least one of the pixel transistors, which will be described later, may be disposed. However, the present inventive concept is not limited thereto. In some embodiments, no pixel transistor may be disposed in the first pixel region LR1. Similar to the first region R1, the second, third and fourth regions R2, R3 and R4 may include second, third and fourth pixel regions PR2, PR3 and PR4, respectively, and second, third and fourth pixel regions LR2, LR3, and LR4, respectively, as illustrated in FIG. 3. The second, third and fourth pixel regions PR2, PR3 and PR4 may include the second, third and fourth photoelectric conversion elements PD2, PD3 and PD4, respectively, and second, third and fourth transfer gates TG2, TG3, and TG4, respectively. In the second to fourth pixel regions LR2 to LR4, at least one of the pixel transistors may be disposed. However, the present inventive concept is not limited thereto, and pixel transistors may not be disposed in some regions of the second to fourth pixel regions LR2 to LR4.

In some embodiments, the first microlens ML1 may at least partially overlap both the first photoelectric conversion element PD1 and the second photoelectric conversion element PD2, as illustrated in FIG. 3, and the first microlens ML1 may be spaced part from the first photoelectric conversion element PD1 and the second photoelectric conversion element PD2 in the third direction D3. In some embodiments, the second microlens ML2 may at least partially overlap both the third photoelectric conversion element PD3 and the fourth photoelectric conversion element PD4, as illustrated in FIG. 3, and, the second microlens ML2 may be spaced part from the third photoelectric conversion element PD3 and the fourth photoelectric conversion element PD4 in the third direction D3. Although FIG. 3 shows that that a single microlens is disposed to overlap two photoelectric conversion elements, the present inventive concept is not limited thereto. The number of photoelectric conversion elements overlapped by a single microlens may vary, for example, three, four, five, six or more. It will be understood that a single microlens may overlap an arbitrary number of photoelectric conversion elements in the plan view.

The first to fourth photoelectric conversion elements PD1, PD2, PD3 and PD4 may include, for example, a photodiode, a photo transistor, a photo gate, a pinned photodiode (PPD), an organic photodiode (OPD), a quantum dot (QD), and a combination thereof, and may generate and/or provide electrical charges (e.g., electrons, holes) in response to incident light.

The first to fourth pixel regions PR1 to PR4 may include the first to fourth transfer gates TG1 to TG4, respectively. Although FIG. 3 illustrates that the first to fourth transfer gates TG1 to TG4 are respectively disposed in contact with the first to fourth photoelectric conversion elements PD1 to PD4, the present inventive concept is not limited thereto. It will be understood that the first to fourth transfer gates TG1 to TG4 may be disposed at arbitrary positions in the first to fourth regions R1 to R4, respectively.

Still referring to FIG. 3, a floating diffusion region FD may be disposed adjacent to the first to fourth transfer gates TG1 to TG4. For example, the first to fourth transfer gates TG1 to TG4 may be gates of first to fourth transfer transistors, respectively, and the floating diffusion region FD may be a source/drain region of each of the first to fourth transfer transistors TG1 to TG4.

The first to fourth transfer transistors TG1 to TG4 may share the single floating diffusion region FD. Although FIG. 3 illustrates the floating diffusion region FD disposed adjacent to the first to fourth transfer gates TG1 to TG4 as a single region, the present inventive concept is not limited thereto. In some embodiments, the floating diffusion region FD may include four separate regions respectively corresponding to the first to fourth transfer gates TG1 to TG4 so as to be adjacent to the first to fourth transfer gates TG1 to TG4. In this case, the four floating diffusion regions may be spaced apart from each other, but they may be electrically connected to each other through wiring or the like to constitute the floating diffusion region FD.

Figure 4:
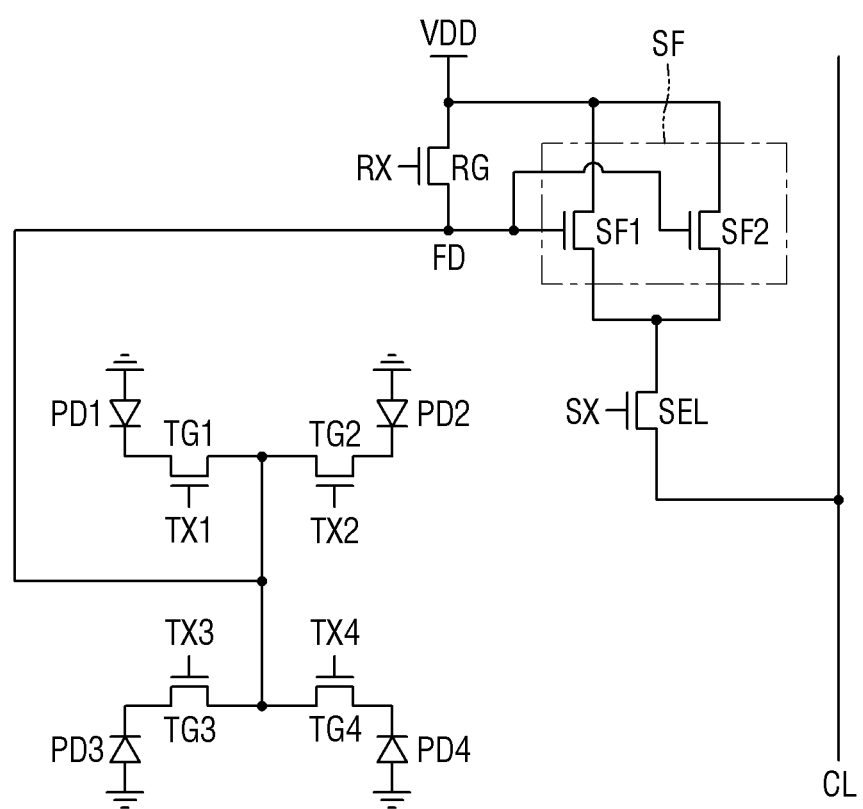
FIGS. 4 to 6 are circuit diagrams of the layout shown in FIG. 3 according to some embodiments of the present inventive concept.

Referring to FIGS. 3 and 4, an image sensor according to some embodiments of the present inventive concept may include first to third pixel transistors SF, RG and SEL. Each of the first to third pixel transistors SF, RG and SEL may be disposed in at least one of the first to fourth pixel regions LR1 to LR4. In some embodiments, a plurality of first pixel transistors may be provided. The first to third pixel transistors SF, RG and SEL may perform different functions.

Specifically, the first and second photoelectric conversion elements PD1 and PD2 may receive light through the first microlens ML1 and may generate first and second signals. The first and second signals may correspond to electrical charges (e.g., photoelectric charges) generated in the first and second photoelectric conversion elements PD1 and PD2 in response to incident light. In some embodiment, the first and second signals may be in proportion to the amount of the incident light. Further, the third and fourth photoelectric conversion elements PD3 and PD4 may receive light through the second microlens ML2 and may generate third and fourth signals. The third and fourth signals may correspond to electrical charges (e.g., photoelectric charges) generated in the third and fourth photoelectric conversion elements PD3 and PD4 in response to incident light. In some embodiment, the third and fourth photoelectric conversion elements PD3 and PD4 may be in proportion to the amount of the incident light. The first to fourth signals may be provided to the floating diffusion region FD through the first to fourth transfer gates TG1 to TG4. In some embodiments, complementary signals may be applied to the first to fourth transfer gates TG1 to TG4, respectively, and any one of the first to fourth signals may be provided to the floating diffusion region FD according to first, second, third and fourth transmission control signals TX1, Tx2, TX3 and TX4.

The floating diffusion region FD may receive any one of the first to fourth signals generated by the first to fourth photoelectric conversion elements PD1 to PD4 and may cumulatively store it. The first to fourth transfer gates TG1 to TG4 may control transfer of the first to fourth signals to the floating diffusion region FD in response to the first, second, third and fourth transmission control signals TX1, Tx2, TX3 and TX4.

In FIG. 4, SF may be a driving transistor that may be controlled by the floating diffusion region FD to generate an output voltage. The transistor SF may be electrically connected to the floating diffusion region FD as illustrated in FIG. 4. The transistor SF may be combined with a current source (e.g., a constant current source) located outside the unit pixel to serve as a source follower buffer amplifier, may amplify a potential change in the floating diffusion region FD and may generate an output voltage Vout. The output voltage Vout may be outputted to the transistor SEL. RG may be a reset transistor that may be controlled by a reset control signal RX and may reset the floating diffusion region FD to VDD. The transistor RG may be electrically connected to the floating diffusion region FD as illustrated in FIG. 4. SEL may be a selection transistor whose drain node may be connected to the source node of the transistor SF, and the transistor SEL may be controlled by a selection signal SX and may output the output voltage Vout to a column line CL connected to the unit pixel.

The first to fourth transmission control signals TX1 to TX4, the reset control signal RX and the selection signal SX may be outputted from the row driver 30 of FIG. 1.

In some embodiments, the unit pixel including the first to fourth regions R1 to R4 may include multiple driving transistors SF1 and SF2 as the plurality of first pixel transistors, as illustrated in FIG. 4. The second pixel transistor may be the reset transistor RG, and the third pixel transistor may be the selection transistor SEL.

The first pixel transistors SF1 and SF2 may be connected to each other in parallel as illustrated in FIG. 4. For example, the drain node of each of the first pixel transistors SF1 and SF2 may be connected to VDD, and the source node of each of the first pixel transistors SF1 and SF2 may be connected to the third pixel transistor SEL and may be controlled by the floating diffusion region FD.

In the image sensor according to some embodiments of the present inventive concept, the plurality of first pixel transistors SF1 and SF2 serving as driving transistors may be disposed in at least one of the first to fourth pixel regions LR1 to LR4, thereby improving the characteristics of pixels of the unit pixel and the read performance, and making the unit pixel strong against noise.

Figure 5:
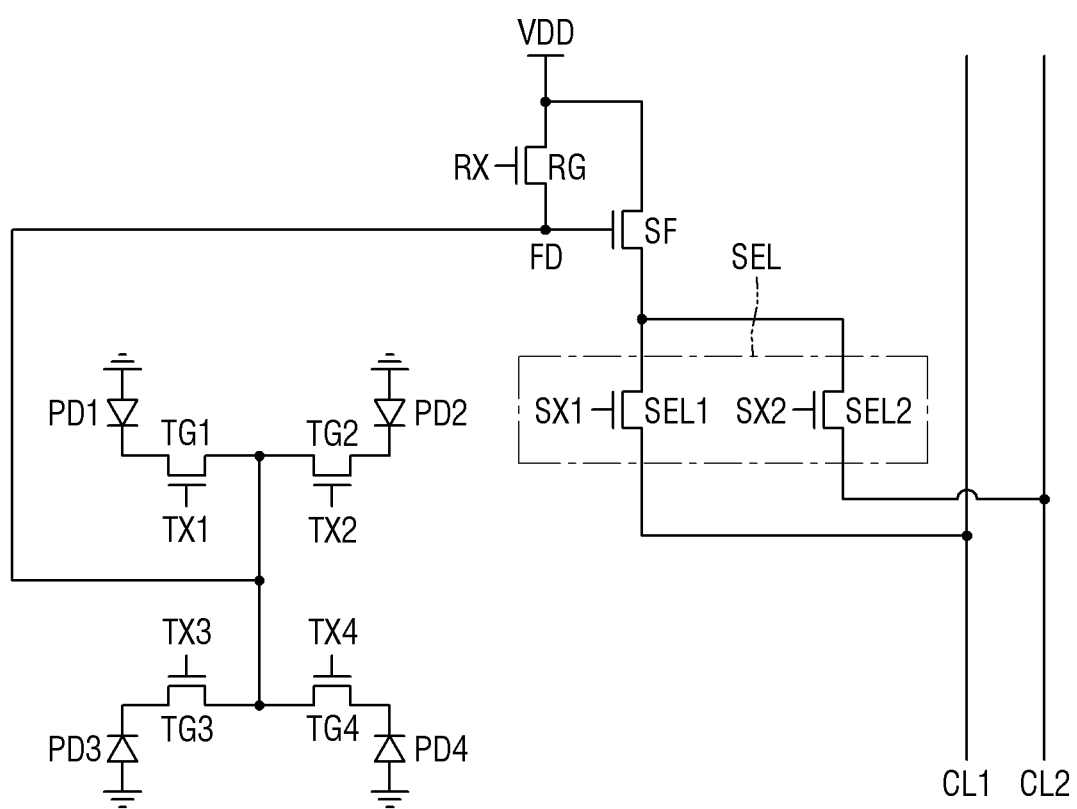

Referring to FIGS. 3 and 5, in some embodiments, the unit pixel including the first to fourth regions R1 to R4 may include multiple selection transistors SEL1 and SEL2 as the plurality of first pixel transistors as illustrated in FIG. 5. The second pixel transistor may be the driving transistor SF and the third pixel transistor may be the reset transistor RG. Hereinafter, differences from those described with reference to FIGS. 3 and 4 will be mainly described.

The first pixel transistors SEL1 and SEL2 may be connected to each other in parallel as illustrated in FIG. 5. For example, the drain node of each of the first pixel transistors SEL1 and SEL2 may be connected to the source node of the second pixel transistor SF, and the source nodes of the first pixel transistors SEL1 and SEL2 may be connected to column lines CL1 and CL2, respectively. Further, each of the first pixel transistors SEL1 and SEL2 may be controlled by first and second selection signals SX1 and SX2, which may be complementary to each other. The first pixel transistors SEL1 and SEL2 may selectively output the output voltage Vout generated by the second pixel transistor SF to the column lines CL1 and CL2. In some embodiments, only one of the first pixel transistors SEL1 and SEL2 may output the output voltage Vout at a time.

In the image sensor according to some embodiments of the present inventive concept, the plurality of first pixel transistors SEL1 and SEL2 serving as selection transistors may be disposed in at least one of the first to fourth pixel regions LR1 to LR4, thereby improving the flexibility of binning.

Figure 6:
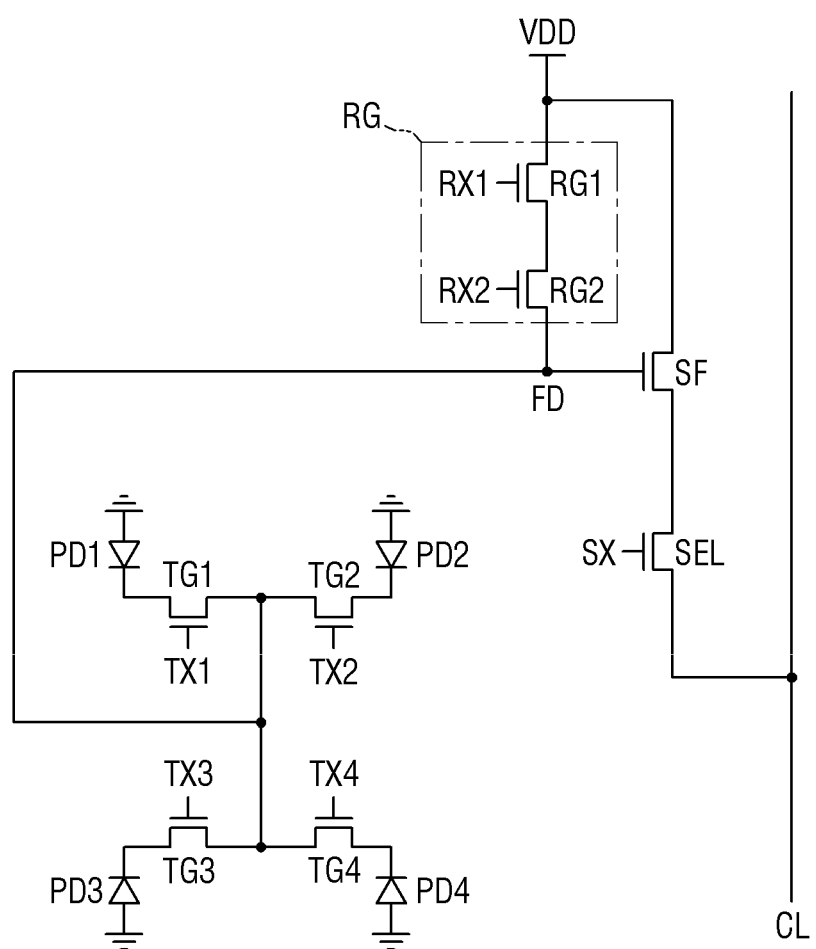
Figure 7:
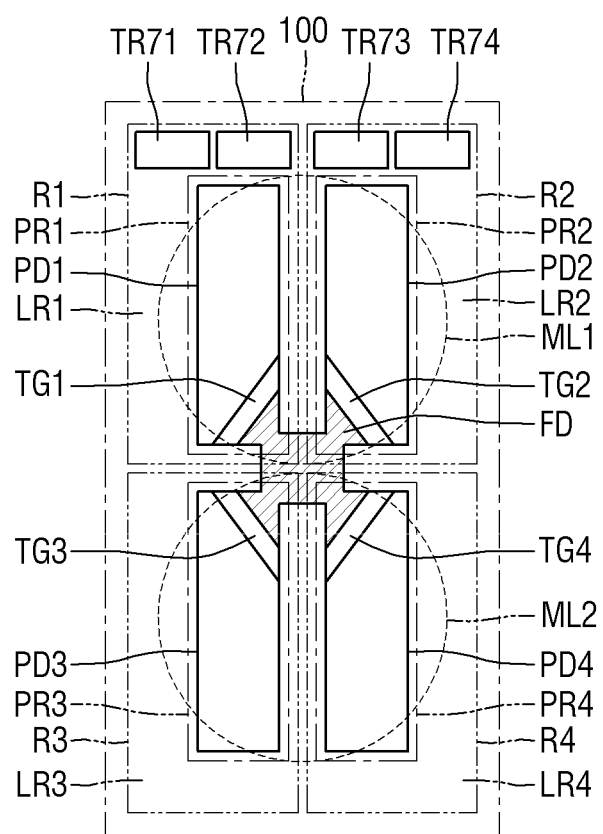
FIGS. 7 to 9 are example layout diagrams illustrating the arrangement of pixel transistors of an image sensor according to some embodiments of the present inventive concept.
Figure 8:
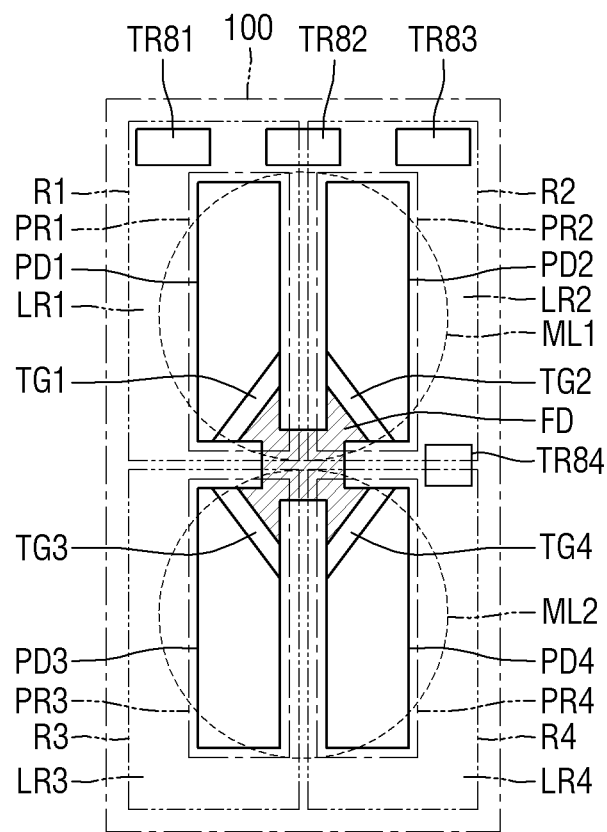
Figure 9:
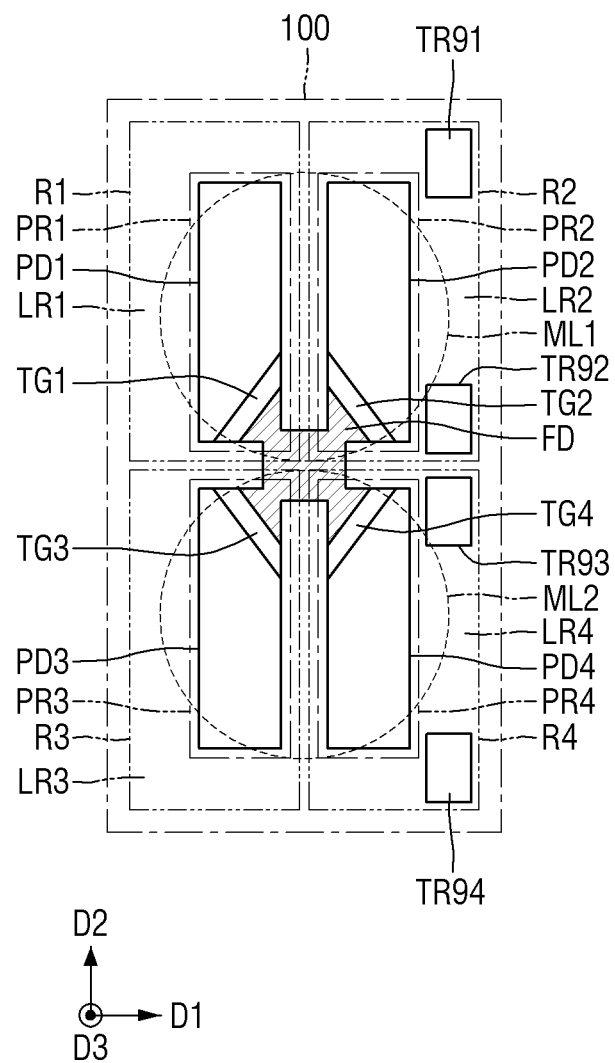

Referring to FIGS. 3 and 6, the unit pixel including the first to fourth regions R1 to R4 may include multiple reset transistors RG1 and RG2 as the plurality of first pixel transistors, as illustrated in FIG. 6. The second pixel transistor may be the driving transistor SF and the third pixel transistor may be the selection transistor SEL. Hereinafter, differences from those described with reference to FIGS. 3 and 4 will be mainly described.

The first pixel transistors RG1 and RG2 may be connected to each other in series as illustrated in FIG. 6. For example, the drain node of one transistor RG1 of the first pixel transistors RG1 and RG2 may be connected to VDD, and the source node of the transistor RG1 may be connected to the drain node of the other transistor RG2 of the first pixel transistors RG1 and RG2. The source node of the other transistor RG2 of the first pixel transistors RG1 and RG2 may be connected to the floating diffusion region FD. In addition, each of the first pixel transistors RG1 and RG2 may be controlled by first and second reset control signals RX1 and RX2.

In the image sensor according to some embodiments of the present inventive concept, the plurality of first pixel transistors RG1 and RG2 serving as reset transistors may be disposed in at least one of the first to fourth pixel regions LR1 to LR4, thereby improving the sensitivity of the image sensor by increasing a conversion gain.

Referring to FIGS. 4 to 7, the plurality of first pixel transistors may include fourth and fifth pixel transistors. The fourth pixel transistor may be disposed, for example, in the second pixel region LR2. Further, the fifth pixel transistor may be disposed, for example, in either the first pixel region LR1 or in the second pixel region LR2.

For example, if the fifth pixel transistor is disposed in the first pixel region LR1, the fifth pixel transistor may be either TR71 or TR72. In some embodiments, if the fifth pixel transistor is disposed in the second pixel region LR2, one of TR73 and TR74 may be the fourth pixel transistor, and the other one of TR73 and TR74 may be the fifth pixel transistor.

For example, if the plurality of first pixel transistors are driving transistors SF1 and SF2 as shown in FIG. 4, the fourth pixel transistor SF1 may be TR71 and the fifth pixel transistor SF2 may be TR73. For example, if the plurality of first pixel transistors are selection transistors SEL 1 and SEL2 as shown in FIG. 5, the fourth pixel transistor SEL1 may be TR71 and the fifth pixel transistor SEL2 may be TR74. For example, if the plurality of first pixel transistors are reset transistors RG1 and RG2 as shown in FIG. 6, the fourth pixel transistor RG1 may be TR73 and the fifth pixel transistor RG2 may be TR74.

Referring to FIGS. 4, 5, 6 and 8, the fourth pixel transistor may be disposed, for example, in the second pixel region LR2. The fifth pixel transistor may be disposed to overlap, for example, a portion of the first pixel region LR1 and a portion of the second pixel region LR2. In some embodiments, the fifth pixel transistor may be disposed to overlap, for example, a portion of the second pixel region LR2 and a portion of the fourth pixel region LR4.

If the fifth pixel transistor is disposed to overlap a portion of the first pixel region LR1 and a portion of the second pixel region LR2, the fifth pixel transistor may be TR82. If the fifth pixel transistor is disposed to overlap a portion of the second pixel region LR2 and a portion of the fourth pixel region LR4, the fifth pixel transistor may be TR84.

For example, if the plurality of first pixel transistors are driving transistors SF1 and SF2 as shown in FIG. 4, the fourth pixel transistor SF1 may be TR81 and the fifth pixel transistor SF2 may be TR83. For example, if the plurality of first pixel transistors are selection transistors SEL 1 and SEL 2 as shown in FIG. 5, the fourth pixel transistor SEL1 may be TR83 and the fifth pixel transistor SEL2 may be TR81. For example, if the plurality of first pixel transistors are reset transistors RG1 and RG2 as shown in FIG. 6, the fourth pixel transistor RG1 may be TR83 and the fifth pixel transistor RG2 may be TR84.

Referring to FIGS. 4, 5, 6 and 9, the fourth pixel transistor may be disposed, for example, in the second pixel region LR2. Further, the fifth pixel transistor may be disposed, for example, in either the second pixel region LR2 or the fourth pixel region LR4.

For example, if the fifth pixel transistor is disposed in the second pixel region LR2, one of TR91 and TR92 may be the fourth pixel transistor, and the other one of TR91 and TR92 may be the fifth pixel transistor. On the other hand, if the fifth pixel transistor is disposed in the fourth pixel region LR4, the fourth pixel transistor may be any one of TR91 and TR92, and the fifth pixel transistor may be any one of TR93 and TR94.

For example, if the plurality of first pixel transistors are driving transistors SF1 and SF2 as shown in FIG. 4, the fourth pixel transistor SF1 may be TR91, and the fifth pixel transistor SF2 may be TR93. For example, if the plurality of first pixel transistors are selection transistors SEL1 and SEL 2 as shown in FIG. 5, the fourth pixel transistor SEL1 may be TR91, and the fifth pixel transistor SEL2 may be TR94. For example, if the plurality of first pixel transistors are reset transistors RG1 and RG2 as shown in FIG. 6, the fourth pixel transistor RG1 may be TR91, and the fifth pixel transistor RG2 may be TR92.

Hereinafter, an image sensor according to some embodiments of the present inventive concept will be described with reference to FIGS. 2 through 6 and 10 through 17. For brevity and clarity of explanation, a repeated description may be omitted.

FIG. 10 and FIGS. 14 through 17 are views showing a single unit pixel of the sensor array region I of FIG. 2 according to some embodiments of the present inventive concept.

Figure 10:
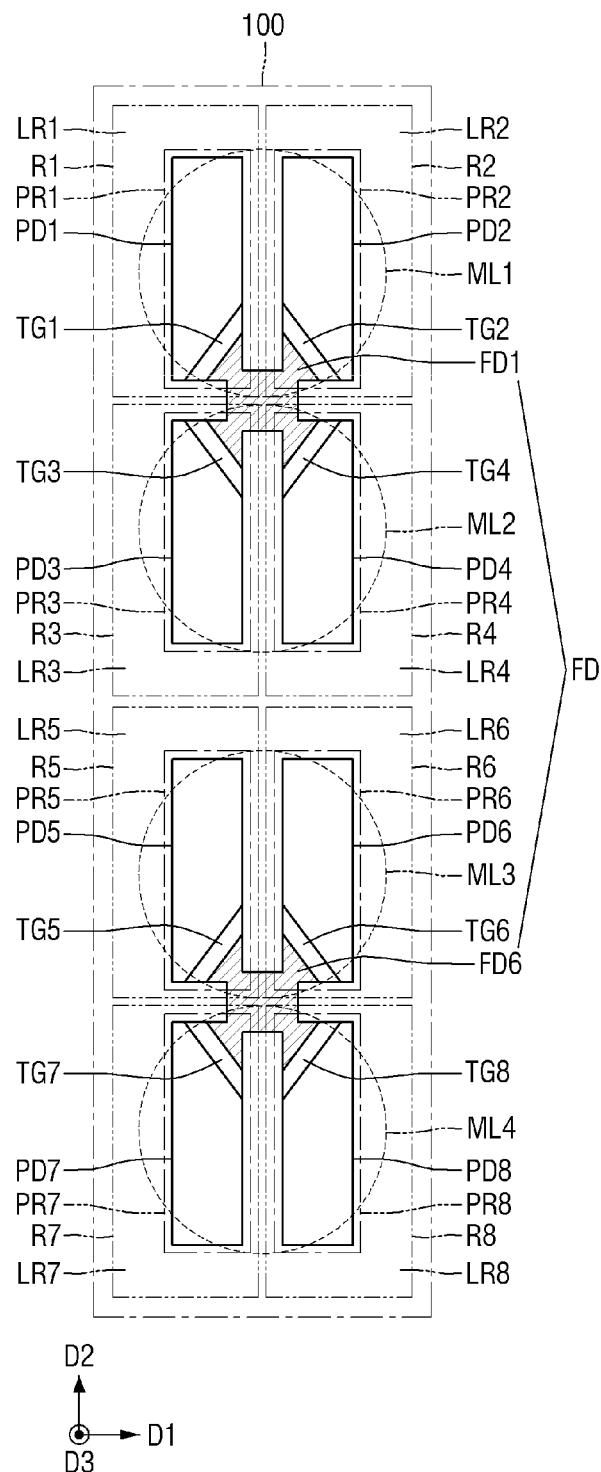
FIG. 10 is an example layout diagram illustrating an image sensor according to some embodiments of the present inventive concept.

Referring to FIGS. 2, 3 and 10, the image sensor according to some embodiments of the present inventive concept may include a unit pixel including first, second, third, fourth, fifth, sixth, seventh and eighth regions R1, R2, R3, R4, R5, R6, R7, and R8 disposed in the substrate 100. A plurality of unit pixels, each of which includes first through eight regions R1 to R8 of FIG. 10, may be arranged in the sensor array region I of FIG. 2. In this case, the plurality of unit pixels may be repeatedly arranged along the first direction D1 and the second direction D2 in the sensor array region I of FIG. 2.

The first to fourth regions R1 to R4 in FIG. 10 may be substantially the same as those described with reference to FIG. 3.

In some embodiments, the fifth, sixth, seventh and eighth regions R5, R6, R7 and R8 may be arranged in the substrate 100 as illustrated in FIG. 10. The fifth region R5 may be disposed adjacent to the third region R3 in the second direction D2. The sixth region R6 may be disposed adjacent to the fifth region R5 in the first direction D1 and may be disposed adjacent to the fourth region R4 in the second direction D2. The seventh region R7 may be disposed adjacent to the fifth region R5 in the second direction D2. The eighth region R8 may be disposed adjacent to the seventh region R7 in the first direction D1 and may be disposed adjacent to the sixth region R6 in the second direction D2.

A third microlens ML3 may be disposed to overlap both the fifth region R5 and the sixth region R6 in a plan view and may be spaced apart from the fifth region R5 and the sixth region R6 in the third direction D3. In other words, the fifth region R5 and the sixth region R6 may share a single microlens (i.e., third microlens ML3). The third microlens ML3 may provide light to a fifth photoelectric conversion element PD5 and a sixth photoelectric conversion element PD6.

A fourth microlens ML4 may be disposed to overlap both the seventh region R7 and the eighth region R8 in a plan view and may be spaced apart from the seventh region R7 and the eighth region R8 in the third direction D3. In other words, the seventh region R7 and the eighth region R8 may share a single microlens (i.e., fourth microlens ML4). The fourth micro lens ML4 may provide light to a seventh photoelectric conversion element PD7 and an eighth photoelectric conversion element PD8.

The fifth region R5 may include a fifth pixel region PR5 and a fifth pixel region LR5. The fifth pixel region PR5 may include the fifth photoelectric conversion element PD5 and a fifth transfer gate TG5. In some embodiments, in the fifth pixel region LR5, at least one of the above-described pixel transistors may be disposed. However, the present inventive concept is not limited thereto. For example, no pixel transistor may be disposed in the fifth pixel region LR5.

Similar to the fifth region R5, the sixth to eighth regions R6 to R8 may include sixth, seventh and eighth pixel regions PR6, PR7 and PR8 and sixth, seventh and eighth pixel regions LR, LR7 and LR8, respectively. The sixth to eighth pixel regions PR6 to PR8 may include the sixth, seventh and eighth photoelectric conversion elements PD6, PD7 and PD8, respectively, and sixth, seventh and eighth transfer gates TG6, TG7 and TG8, respectively. In some embodiments, in the sixth to eighth pixel regions LR6 to LR8, at least one of the above-described pixel transistors may be disposed. However, the present inventive concept is not limited thereto, and no pixel transistors may be disposed in some regions of the sixth to eighth pixel regions LR6 to LR8. In some embodiments, the fifth, sixth, seventh, and eighth pixel regions PR5 to PR8 may be different from the fifth, sixth, seventh, and eighth pixel regions LR5 to LR8, respectively, and may not overlap the fifth, sixth, seventh, and eighth pixel regions LR5 to LR8, respectively. For example, the fifth pixel region PR5 may not overlap the fifth pixel region LR5, as illustrated in FIG. 10.

The third microlens ML3 may at least partially overlap both the fifth photoelectric conversion element PD5 and the sixth photoelectric conversion element PD6 and may be spaced part from the fifth photoelectric conversion element PD5 and the sixth photoelectric conversion element PD6 in the third direction D3. The fourth microlens ML4 may at least partially overlap both the seventh photoelectric conversion element PD7 and the eighth photoelectric conversion element PD8 and may be spaced part from the seventh photoelectric conversion element PD7 and the eighth photoelectric conversion element PD8 in the third direction D3.

Each of the fifth to eighth photoelectric conversion elements PD5 to PD8 may be substantially the same as, for example, one of the first to fourth photoelectric conversion elements PD1 to PD4.

The fifth to eighth pixel regions PR5 to PR8 may include the fifth, sixth, seventh and eighth transfer gates TG5, TG6, TG7 and TG8. Although FIG. 10 illustrates that the fifth to eighth transfer gates TG5 to TG8 are respectively disposed in contact with the fifth to eighth photoelectric conversion elements PD5 to PD8, the present inventive concept is not limited thereto. In other words, in some embodiments, the fifth to eighth transfer gates TG5 to TG8 may be disposed at arbitrary positions in the fifth to eighth regions R5 to R8, respectively.

Still referring to FIG. 10, the floating diffusion region FD may include a first floating diffusion region FD1 disposed adjacent to the first to fourth transfer gates TG1 to TG4 and a second floating diffusion region FD2 disposed adjacent to the fifth to eighth transfer gates TG5 to TG8. The first floating diffusion region FD1 may be a source/drain region of each of the first to fourth transfer transistors. For example, the fifth to eighth transfer gates TG5 to TG8 may be respective gates of fifth to eighth transfer transistors, and the second floating diffusion region FD2 may be a source/drain region of each of the fifth to eighth transfer transistors TG5 to TG8.

The first floating diffusion region FD1 and the second floating diffusion region FD2 may be electrically connected to each other. In other words, the first to eighth transfer transistors may share the floating diffusion region FD. It will be understood that the first floating diffusion region FD1 and the second floating diffusion region FD2 may be collectively considered as a single floating diffusion region FD when the first and second diffusion regions FD1 and FD2 are electrically connected to each other.

The fifth and sixth photoelectric conversion elements PD5 and PD6 may receive light through the third microlens ML3 and may generate fifth and sixth signals that may correspond to photoelectric charges generated in the fifth and sixth photoelectric conversion elements PD5 and PD6 in response to incident light. In some embodiments, the fifth and sixth signals may be in proportion to the amount of incident light. The seventh and eighth photoelectric conversion elements PD7 and PD8 may receive light through the fourth microlens ML4 and may generate seventh and eighth signals that may correspond to photoelectric charges in response to incident light. In some embodiments, the seventh and eighth signals may be in proportion to the amount of incident light.

The first to eighth signals may be provided to the floating diffusion region FD through the first to eighth transfer gates TG1 to TG8. In this case, complementary signals may be applied to the first to eighth transfer gates TG1 to TG8, respectively, and any one of the first, second, third, fourth, fifth, sixth, seventh and eighth signals may be provided to the floating diffusion region FD according to first, second, third, fourth, fifth, sixth, seventh and eighth transmission control signals TX1, TX2, TX3, TX4, TX5, TX6, TX7, and TX8. The floating diffusion region FD may receive any one of the first to eighth signals generated by the first to eighth photoelectric conversion elements PD1 to PD8 and may cumulatively store it.

In the following description, pixel transistors SF, SEL and RG in FIGS. 11 to 13 may be substantially the same as the pixel transistors SF, SEL and RG discussed with reference to FIGS. 4 to 6.

Figure 11:
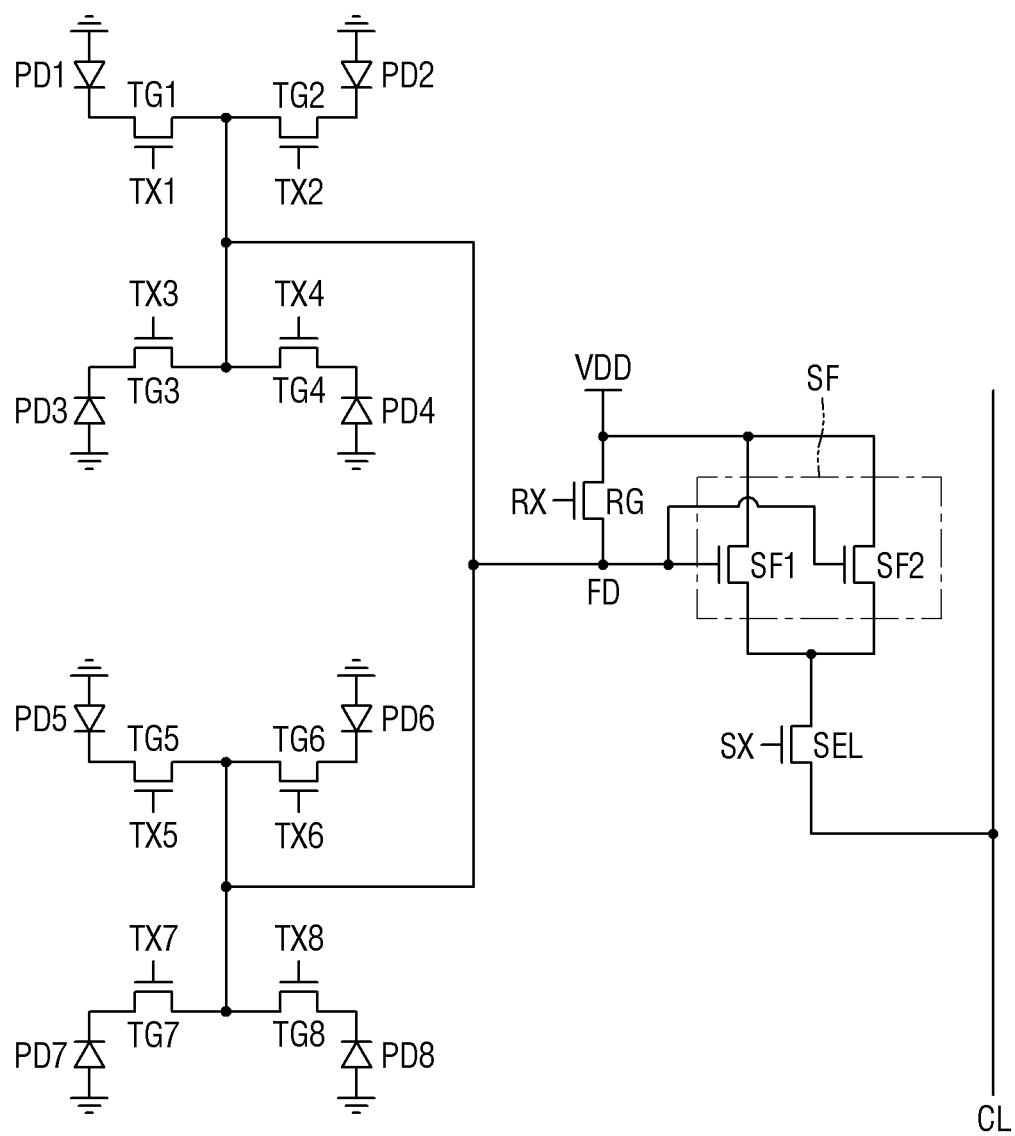
FIGS. 11 to 13 are circuit diagrams of the layout shown in FIG. 10 according to some embodiments of the present inventive concept.

Referring to FIGS. 10 and 11, the image sensor according to some embodiments of the present inventive concept may include first to third pixel transistors SF, RG and SEL. Each of the first to third pixel transistors SF, RG and SEL may be disposed in at least one of the first to eighth pixel regions LR1 to LR8.

In some embodiments, the unit pixel including the first to eighth regions R1 to R8 may include two driving transistors SF1 and SF2 as the plurality of first pixel transistors.

Figure 12:
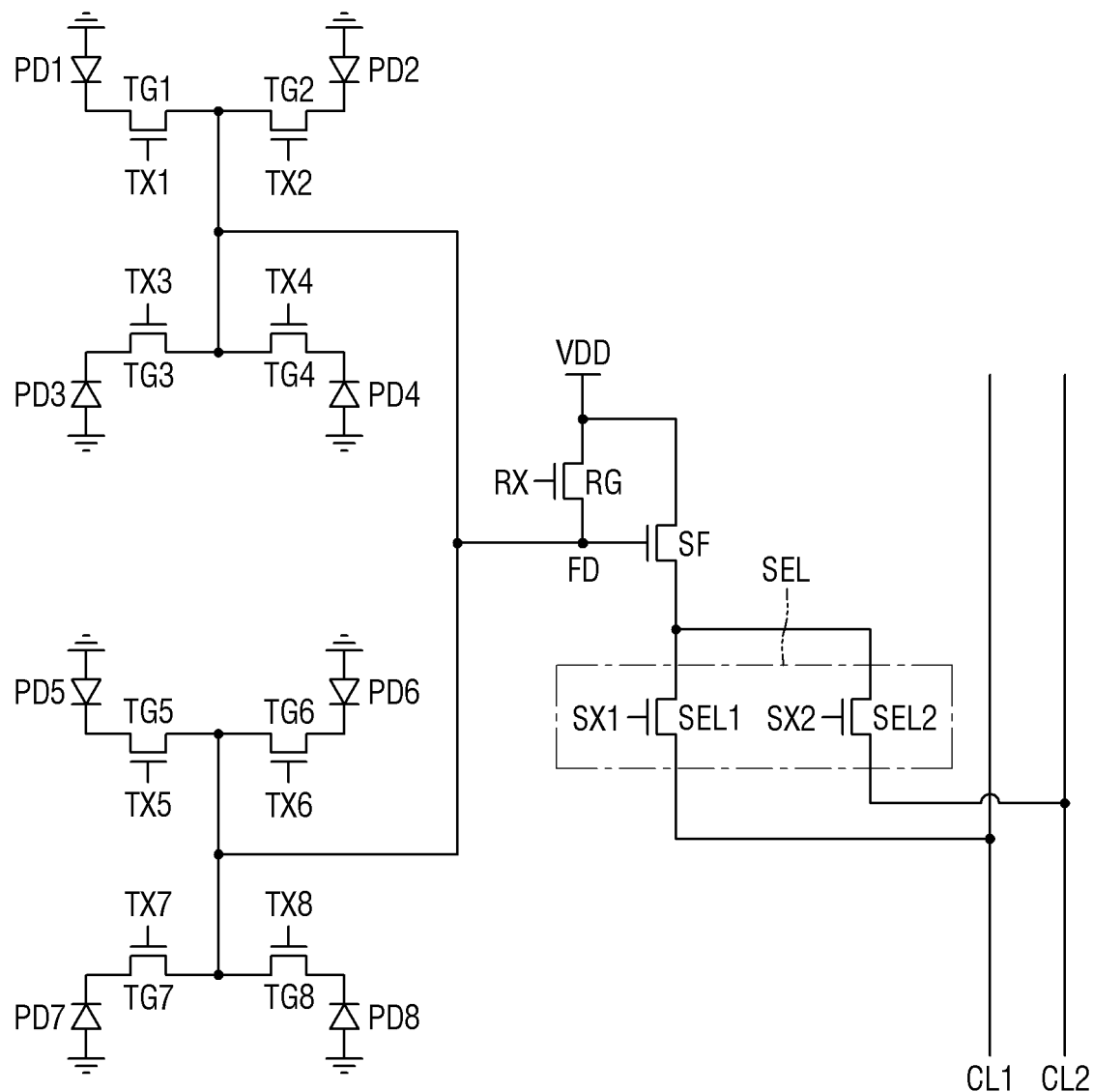

Referring to FIGS. 10 and 12, in some embodiments, the unit pixel including the first to eighth regions R1 to R8 may include two selection transistors SEL1 and SEL2 as the plurality of first pixel transistors.

Figure 13:
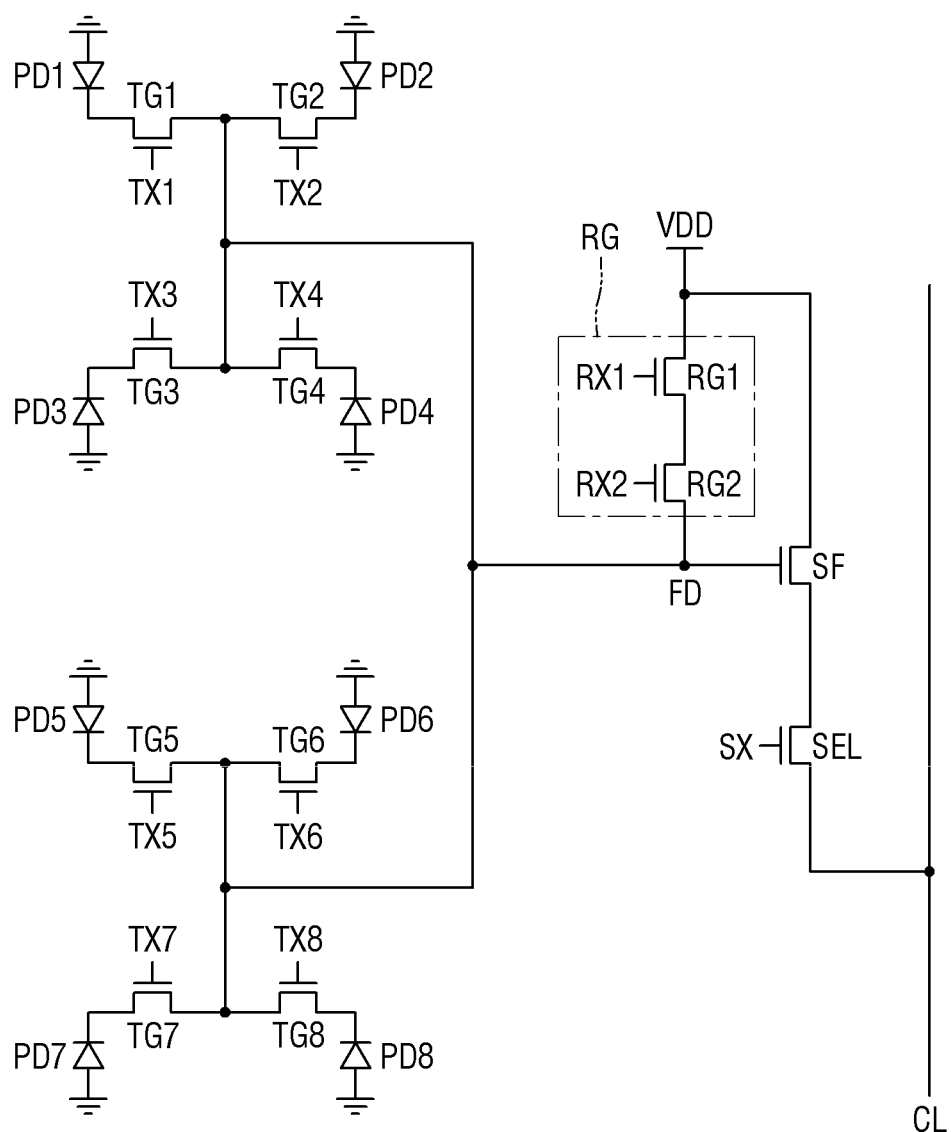
Figure 14:
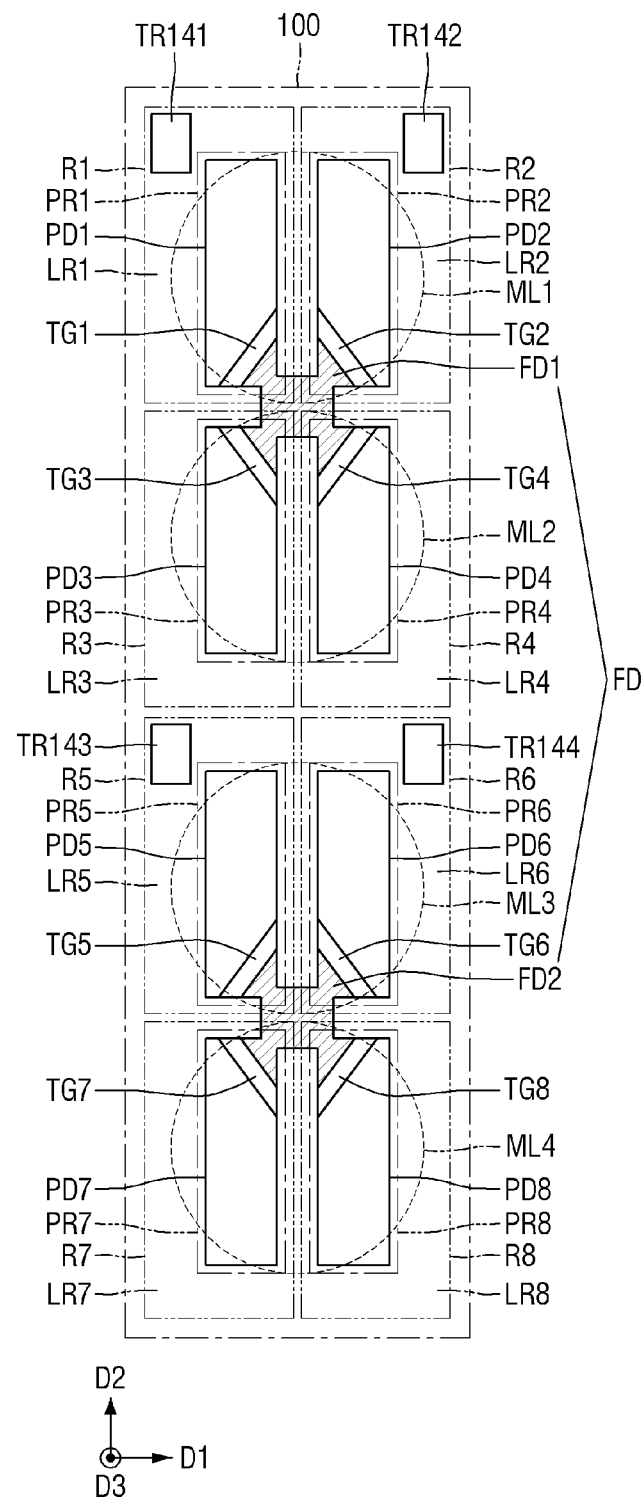
FIGS. 14 to 17 are example layout diagrams illustrating the arrangement of pixel transistors of an image sensor according to some embodiments of the present inventive concept.
Figure 15:
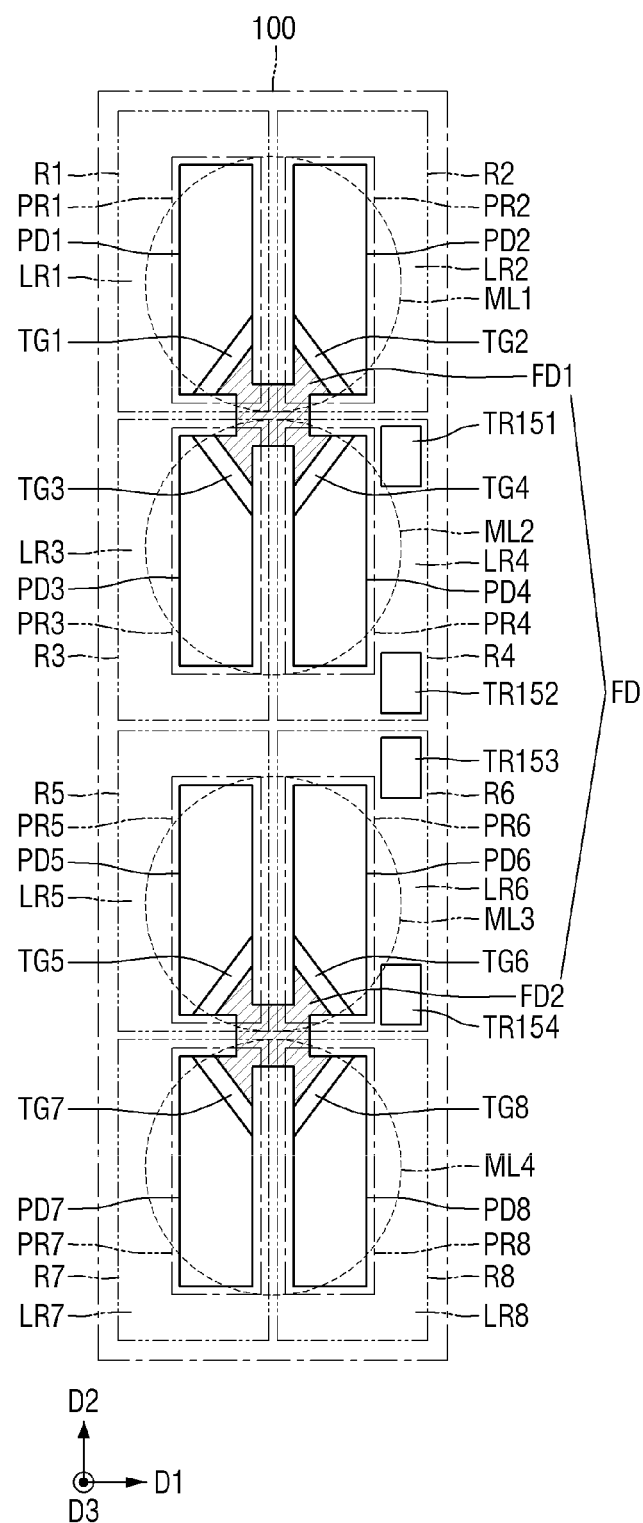
Figure 16:
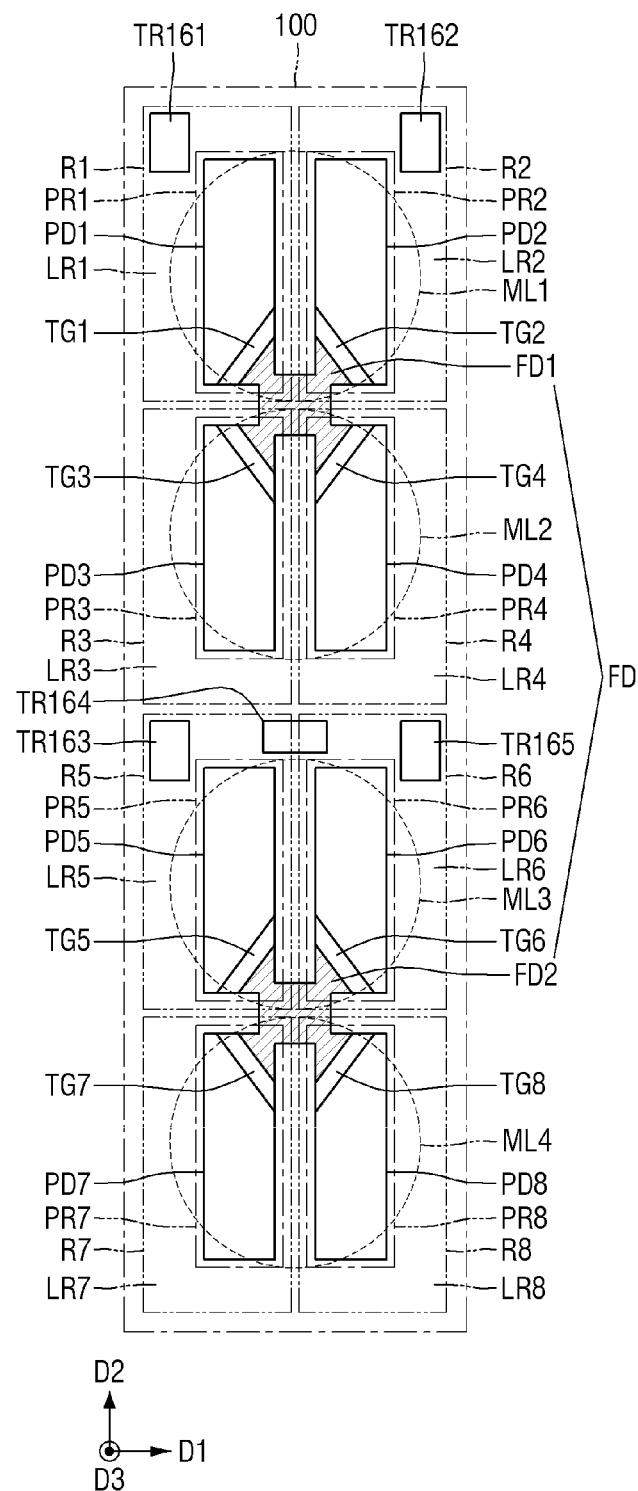
Figure 17:
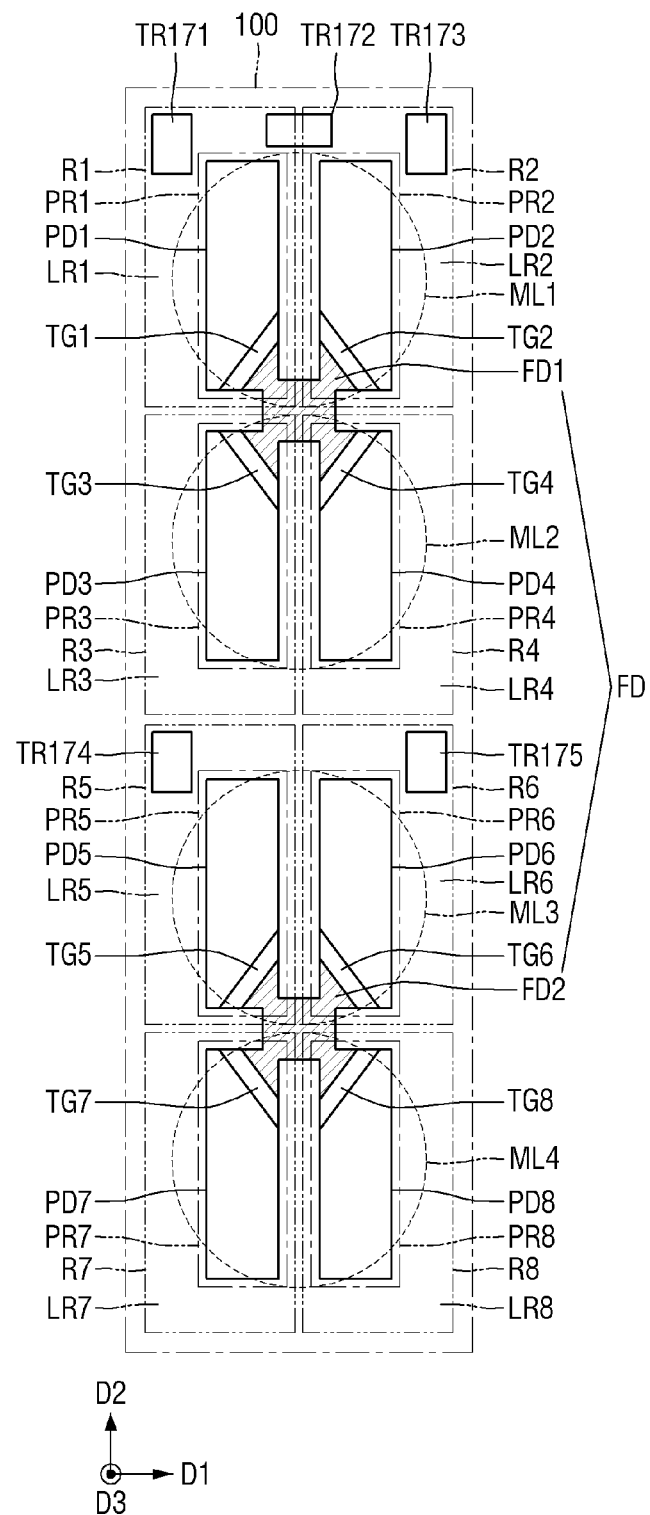

Referring to FIGS. 10 and 13, in some embodiments, the unit pixel including the first to eighth regions R1 to R8 may include two reset transistors RG1 and RG2 as the plurality of first pixel transistors.

In some embodiments, the plurality of first pixel transistors may include a fourth pixel transistor and a fifth pixel transistor. Referring to FIGS. 11 to 14, the fourth pixel transistor may be disposed, for example, in either the first pixel region LR1 or the fifth pixel region LR5. The fifth pixel transistor may be disposed, for example, in any one of the second pixel region LR2, the fifth pixel region LR5 and the sixth pixel region LR6. For example, if the fourth pixel transistor is disposed in the first pixel region LR1, the fourth pixel transistor may be TR141. In this case, the fifth pixel transistor may be, for example, any one of TR142, TR143 and TR144. In some embodiments, when the fourth pixel transistor is disposed in the fifth pixel region LR5, the fourth pixel transistor may be TR143. In this case, the fifth pixel transistor may be any one of TR141, TR142 and TR144.

For example, if the plurality of first pixel transistors are driving transistors SF1 and SF2 as shown in FIG. 11, the fourth pixel transistor SF1 may be TR141, and the fifth pixel transistor SF2 may be TR142. In some embodiments, the fourth pixel transistor SF1 may be TR143, and the fifth pixel transistor SF2 may be TR144. For example, if the plurality of first pixel transistors are selection transistors SEL1 and SEL 2 as shown in FIG. 12, the fourth pixel transistor SEL1 may be TR141, and the fifth pixel transistor SEL2 may be TR142. In some embodiments, the fourth pixel transistor SEL1 may be TR143, and the fifth pixel transistor SEL2 may be TR142. For example, if the plurality of first pixel transistors are reset transistors RG1 and RG2 as shown in FIG. 13, the fourth pixel transistor RG1 may be TR141, and the fifth pixel transistor RG2 may be TR142. In some embodiments, the fourth pixel transistor RG1 may be TR141, and the fifth pixel transistor RG2 may be TR143.

Referring to FIGS. 11 to 13 and 15, the fourth pixel transistor may be disposed, for example, in the fourth pixel region LR4. Further, the fifth pixel transistor may be disposed, for example, in either the fourth pixel region LR4 or the sixth pixel region LR6. For example, the fourth pixel transistor may be TR151. The fifth pixel transistor may be any one of TR152, TR153 and TR154.

For example, if the plurality of first pixel transistors are driving transistors SF1 and SF2 as shown in FIG. 11, the fourth pixel transistor SF1 may be TR151, and the fifth pixel transistor SF2 may be TR152. For example, if the plurality of first pixel transistors are selection transistors SEL 1 and SEL 2 as shown in FIG. 12, the fourth pixel transistor SEL1 may be TR151, and the fifth pixel transistor SEL2 may be TR154. For example, if the plurality of first pixel transistors are reset transistors RG1 and RG2 as shown in FIG. 13, the fourth pixel transistor RG1 may be TR151, and the fifth pixel transistor RG2 may be TR152.

Although FIGS. 11, 12 and 13 illustrate that two pixel transistors are provided for each type, this is only for convenience of description and illustration, and the present inventive concept is not limited thereto. For example, referring to FIG. 16, the plurality of first pixel transistors may further a sixth pixel transistor, and therefore may include the fourth, fifth and sixth pixel transistors. For example, if the plurality of first pixel transistors are driving transistors, the fourth to sixth pixel transistors may be TR163, TR164 and TR165, respectively. In this case, the fourth to sixth pixel transistors may be connected in parallel with each other. Further, referring to FIG. 17, if the plurality of first pixel transistors are driving transistors, the fourth to sixth pixel transistors may be TR171, TR172 and TR173.

Hereinafter, an image sensor according to some embodiments of the present inventive concept will be described with reference to FIGS. 2 through 10, FIGS. 18A, 18B, and 19 through 25. For brevity and clarity of explanation, repeated descriptions may be omitted.

FIGS. 18A, 18B and 22 to 25 are views showing a single unit pixel of the sensor array region I of FIG. 2.

Referring to FIGS. 2, 3, 10, 18A and 18B, the first to fourth regions R1 to R4 in FIG. 10A may be substantially the same as those discussed with reference to FIG. 3.

Figure 18A:
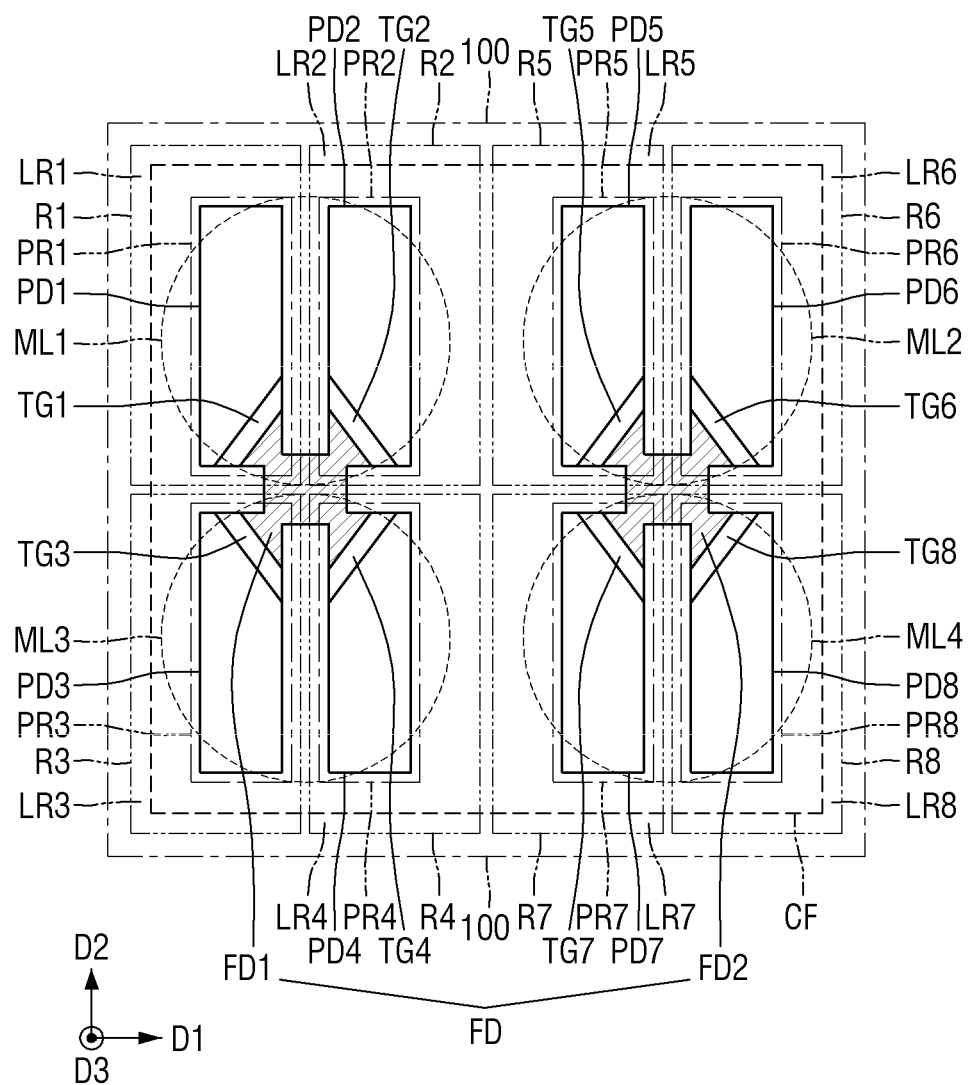
FIGS. 18A and 18B are example layout diagrams illustrating an image sensor according to some embodiments of the present inventive concept.

In some embodiments, the fifth, sixth, seventh and eighth regions R5, R6, R7 and R8 may be arranged in the substrate 100, as illustrated in FIG. 18A. The fifth region R5 may be disposed adjacent to the second region R2 in the first direction D1. The sixth region R6 may be disposed adjacent to the fifth region R5 in the first direction D1. The seventh region R7 may be disposed adjacent to the fourth region R4 in the first direction D1 and may be disposed adjacent to the fifth region R5 in the second direction D2. The eighth region R8 may be disposed adjacent to the seventh region R7 in the first direction D1 and may be disposed adjacent to the sixth region R6 in the second direction D2.

The components included in the fifth to eighth regions R5 to R8 may be substantially the same as those described with reference to FIG. 10.

In some embodiments, a single color filter CF may be disposed between the first to eighth regions R1 to R8 and the first to fourth microlenses ML1 to ML4.

Figure 18B:
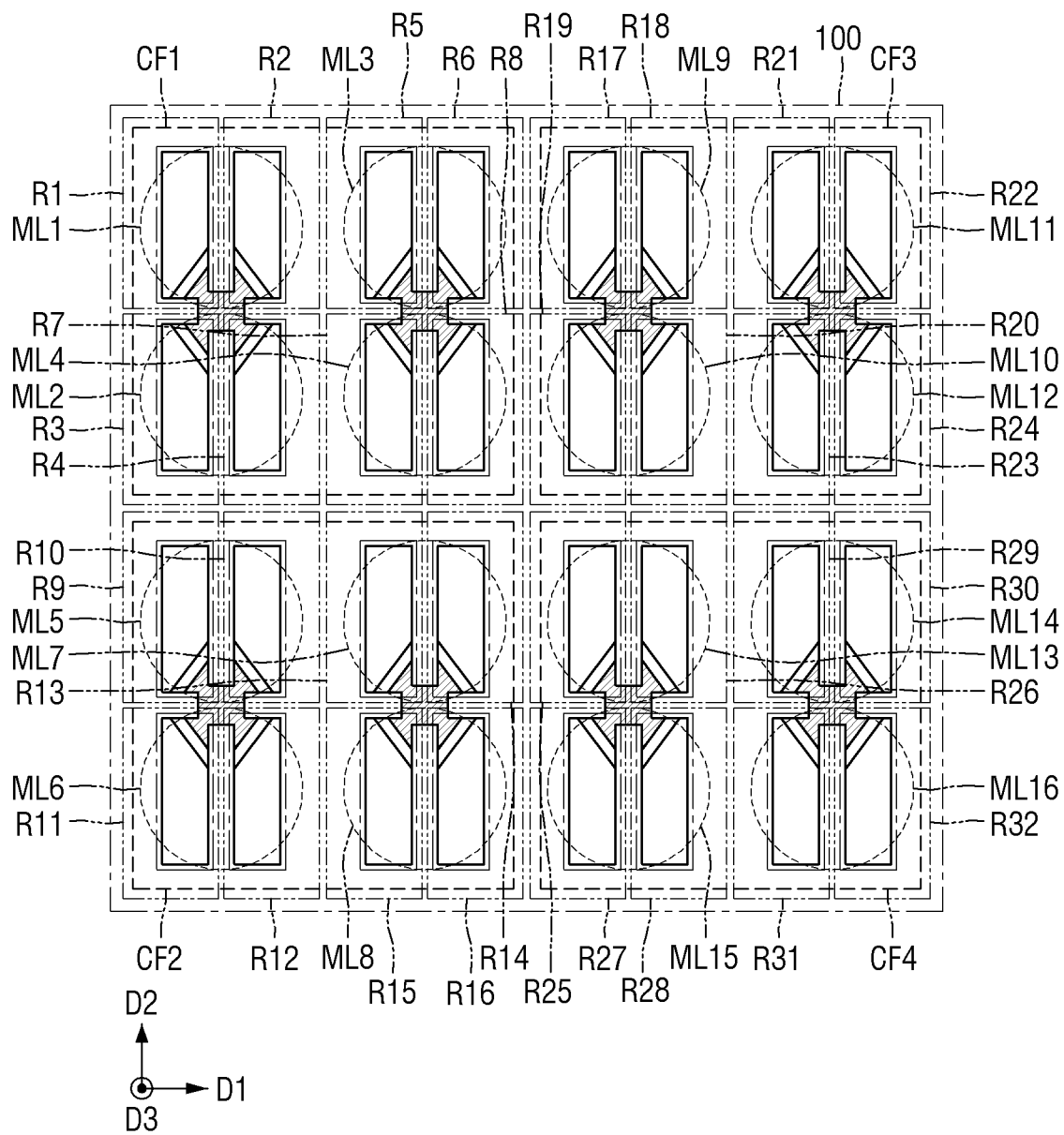

For example, referring to FIG. 18B, the first to eighth regions R1 to R8 in FIG. 18B may be substantially the same as the unit pixel R1 to R8 of the image sensor shown in FIG. 18A. In FIG. 18B, if the unit pixel including the first to eighth regions R1 to R8 of the image sensor shown in FIG. 18A is referred to as a first unit pixel, a second unit pixel including the ninth to sixteenth regions R9 to R16 may be disposed adjacent to the first unit pixel in the second direction D2. Also, a third unit pixel including the seventeenth to twenty-fourth regions R17 to R24 may be disposed adjacent to the first unit pixel in the first direction D1. Further, a fourth unit pixel including the twenty-fifth to thirty-second regions R25 to R32 may be disposed adjacent to the second unit pixel including ninth to sixteenth regions R9 to R16 in the first direction D1. Each of the second to fourth unit pixels may be substantially the same as the first unit pixel.

Each of the first to fourth unit pixels may include a plurality of transistors of at least one type of a driving transistor, a reset transistor and a selection transistor.

In some embodiments, a single color filter may be disposed between the first to eighth regions R1 to R8 and the first to fourth microlenses ML1 to ML4 and may be referred to as a first color filter CF1. That is, the first to eighth regions R1 to R8 may share the first color filter CF1. In some embodiments, a second color filter CF2, which is a single color filter, may be disposed between the ninth to sixteenth regions R9 to R16 and fifth to eighth microlenses ML5 to ML8. That is, the ninth to sixteenth regions R9 to R16 may share the second color filter CF2. Further, a third color filter CF3, which is a single color filter, may be disposed between the seventeenth to twenty-fourth regions R17 to R24 and ninth to twelfth microlenses ML9 to ML12. That is, the seventeenth to twenty-fourth regions R17 to R24 may share the third color filter CF3. Furthermore, a fourth color filter CF4, which is a single color filter, may be disposed between the twenty-fifth to thirty-second regions R25 to R32 and thirteenth to sixteenth microlenses ML13 to ML16. That is, the twenty-fifth to thirty-second regions R25 to R32 may share the fourth color filter CF4.

The first to fourth color filters CF1 to CF4 may pass different colors, respectively. However, the present inventive concept is not limited thereto. For example, it will be understood that some of the first to fourth color filters CF1 to CF4 may pass the same color. For example, the first color filter CF1 may be a color filter that passes blue-based colors. The second and third color filters CF2 and CF3 may be color filters that pass green-based colors. The fourth color filter CF4 may be a color filter that passes red-based colors.

The present inventive concept is not limited to the shape of the color filters (CF1, CF2, CF3, CF4) in the FIGS. 18A and 18B, but is only schematically represented. The color filters of various shapes can be applied.

The pixel transistors SF, SEL and RG in FIGS. 19 to 21 may be substantially the same as the pixel transistors SF, SEL and RG described with reference to FIGS. 4 to 6.

Figure 19:
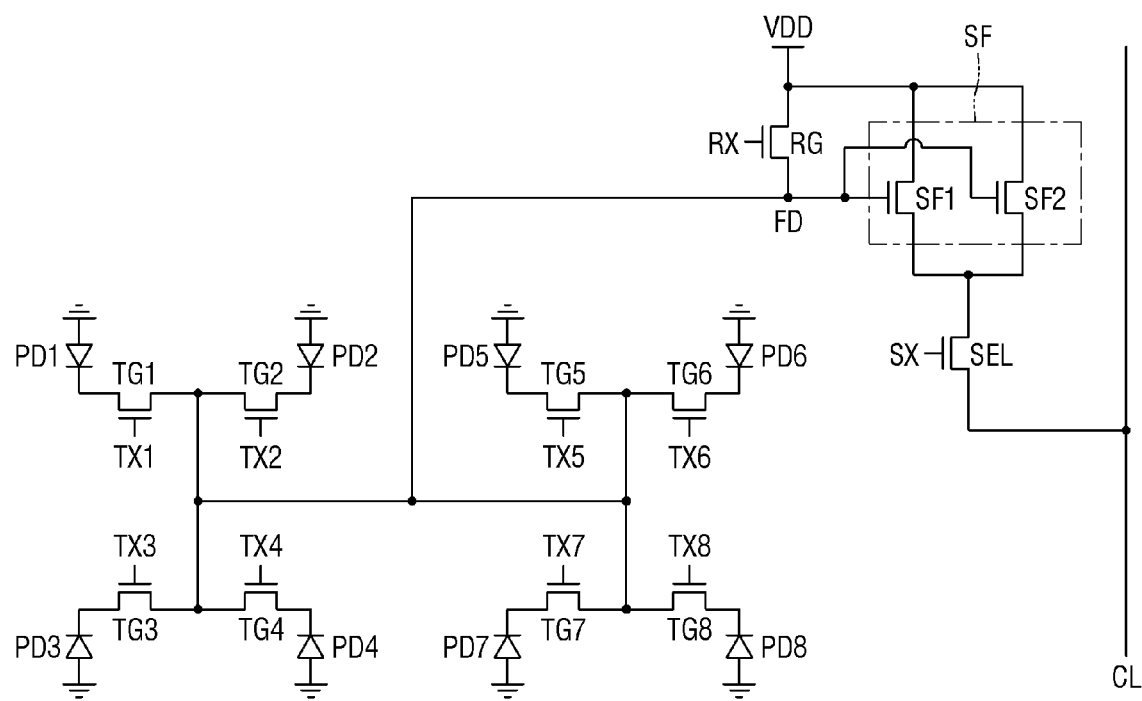
FIGS. 19 to 21 are circuit diagrams of the layout shown in FIG. 18A according to some embodiments of the present inventive concept.

Referring to FIGS. 18A and 19, the image sensor according to some embodiments of the present inventive concept may include first to third pixel transistors SF, RG and SEL. In some embodiments, the unit pixel including the first to eighth regions R1 to R8 may include driving transistors SF1 and SF2 as the plurality of first pixel transistors.

Figure 20:
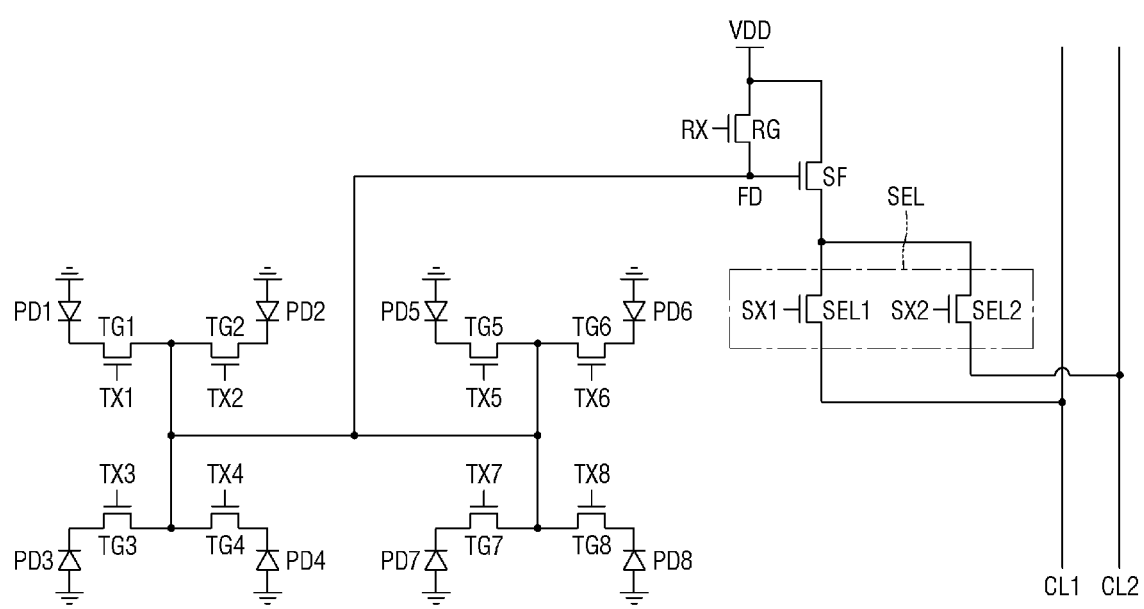

Referring to FIGS. 18A and 20, in some embodiments, the unit pixel including the first to eighth regions R1 to R8 may include selection transistors SEL1 and SEL2 as the plurality of first pixel transistors.

Figure 21:
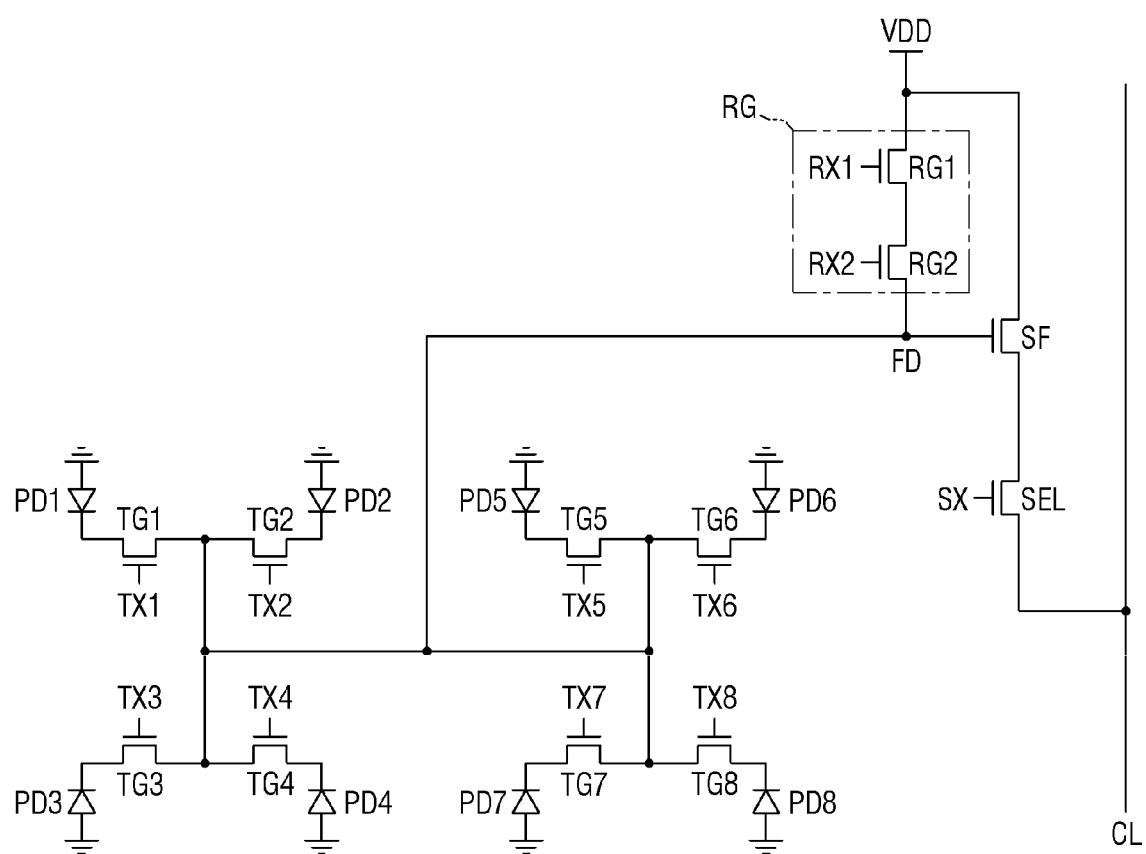

Referring to FIGS. 18A and 21, in some embodiments, the unit pixel including the first to eighth regions R1 to R8 may include reset transistors RG1 and RG2 as the plurality of first pixel transistors.

In some embodiments the plurality of first pixel transistors may include a fourth pixel transistor and a fifth pixel transistor. Referring to FIGS. 19 to 22, the fourth pixel transistor may be disposed, for example, in the first pixel region LR1. The fifth pixel transistor may be disposed, for example, in either the second pixel region LR2 or the sixth pixel region LR6. For example, the fourth pixel transistor may be TR221. The fifth pixel transistor may be either TR222 or TR224. One of the second and third pixel transistors may be TR223.

For example, if the plurality of first pixel transistors are driving transistors SF1 and SF2 as shown in FIG. 19, the fourth pixel transistor SF1 may be TR221, and the fifth pixel transistor SF2 may be TR222. For example, if the plurality of first pixel transistors are selection transistors SEL1 and SEL2 as shown in FIG. 20, the fourth pixel transistor SEL1 may be TR221, and the fifth pixel transistor SEL2 may be TR224. For example, if the plurality of first pixel transistors are reset transistors RG1 and RG2 as shown in FIG. 21, the fourth pixel transistor RG1 may be TR221, and the fifth pixel transistor RG2 may be TR222.

Referring to FIGS. 19 to 21 and 23, the fourth pixel transistor may be disposed, for example, in the sixth pixel region LR6. The fifth pixel transistor may be disposed to overlap, for example, a portion of the second pixel region LR2, a portion of the fourth pixel region LR4, a portion of the fifth pixel region LR5 and a portion of the seventh pixel region LR7. For example, the fourth pixel transistor may be TR234. The fifth pixel transistor may be, for example, TR233.

For example, if the plurality of first pixel transistors are reset transistors RG1 and RG2 as shown in FIG. 21, the fourth pixel transistor RG1 may be TR234, and the fifth pixel transistor RG2 may be TR233. One of the second and third pixel transistors may be TR231.

Referring to FIGS. 19 to 21 and 24, the fourth and fifth pixel transistors may be disposed to overlap, for example, a portion of the second pixel region LR2 and a portion of the fifth pixel region LR5. In some embodiments, the fourth and fifth pixel transistors may be disposed to overlap, for example, a portion of the fourth pixel region LR4 and a portion of the seventh pixel region LR7. For example, the fourth pixel transistor may be TR241 and the fifth pixel transistor may be TR242. In some embodiments, the fourth pixel transistor may be TR243 and the fifth pixel transistor may be TR244.

For example, if the plurality of first pixel transistors are driving transistors SF1 and SF2 as shown in FIG. 19, the fourth pixel transistor SF1 may be TR243, and the fifth pixel transistor SF2 may be TR244. For example, if the plurality of first pixel transistors are selection transistors SEL1 and SEL2 as shown in FIG. 20, the fourth pixel transistor SEL1 may be TR241, and the fifth pixel transistor SEL2 may be TR242. For example, if the plurality of first pixel transistors are reset transistors RG1 and RG2 as shown in FIG. 21, the fourth pixel transistor RG1 may be TR241, and the fifth pixel transistor RG2 may be TR242.

Figure 22:
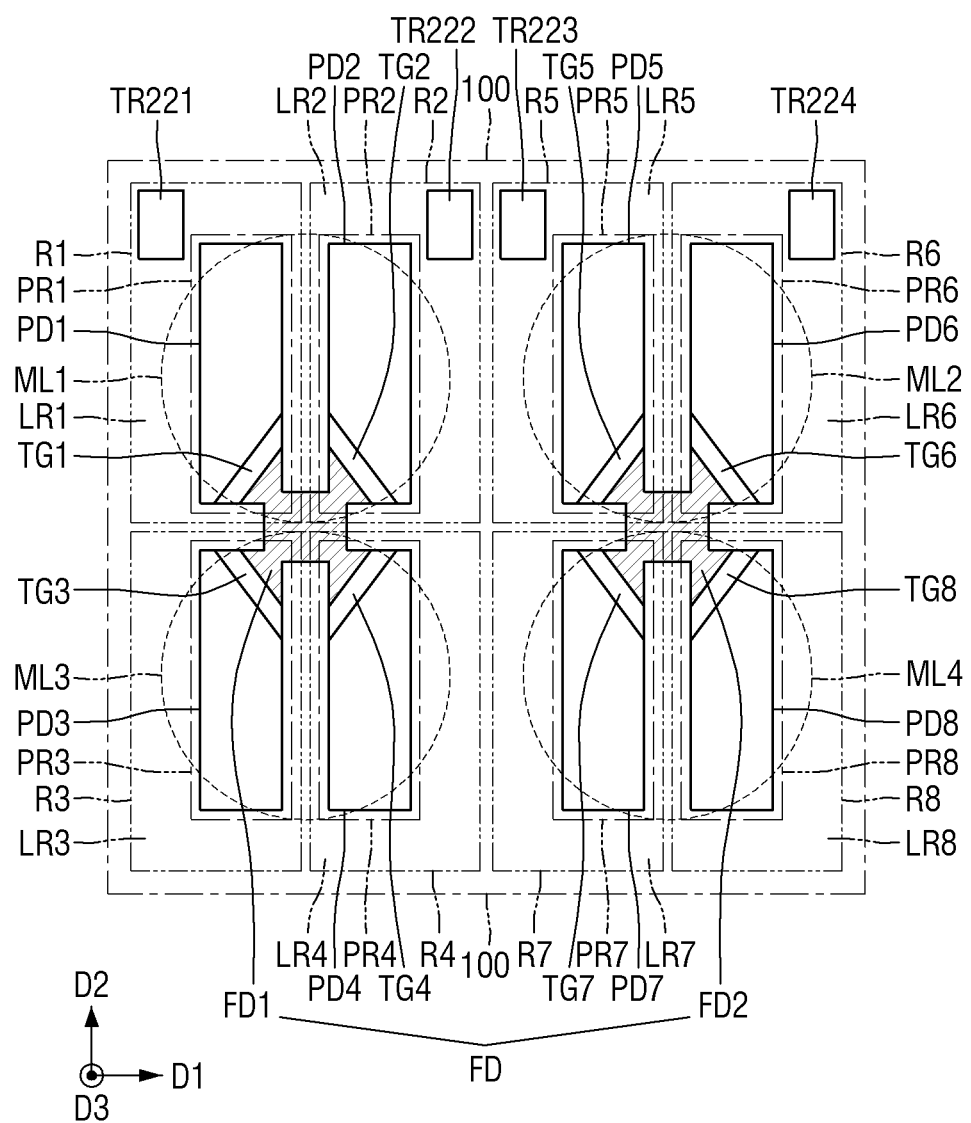
FIGS. 22 to 25 are example layout diagrams illustrating the arrangement of pixel transistors of an image sensor according to some embodiments of the present inventive concept.
Figure 23:
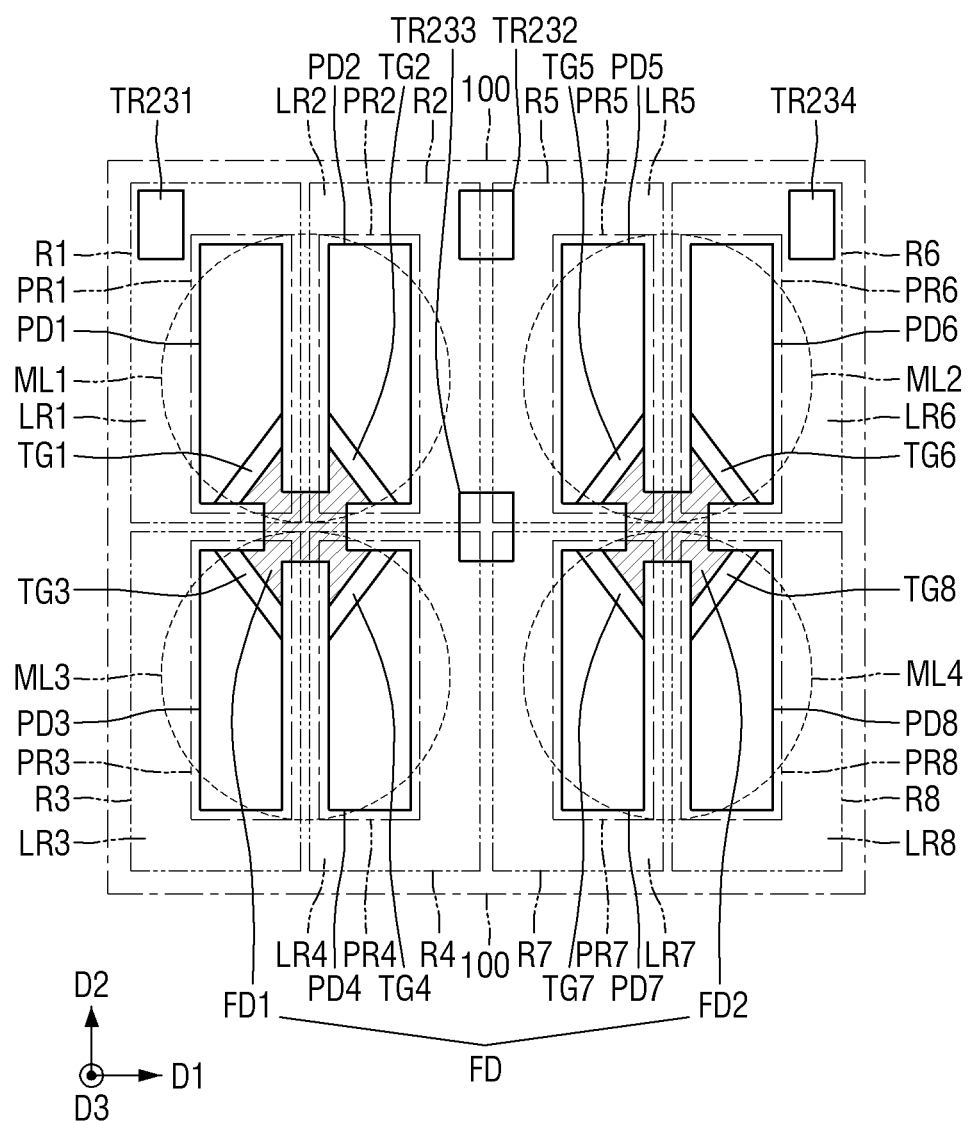
Figure 24:
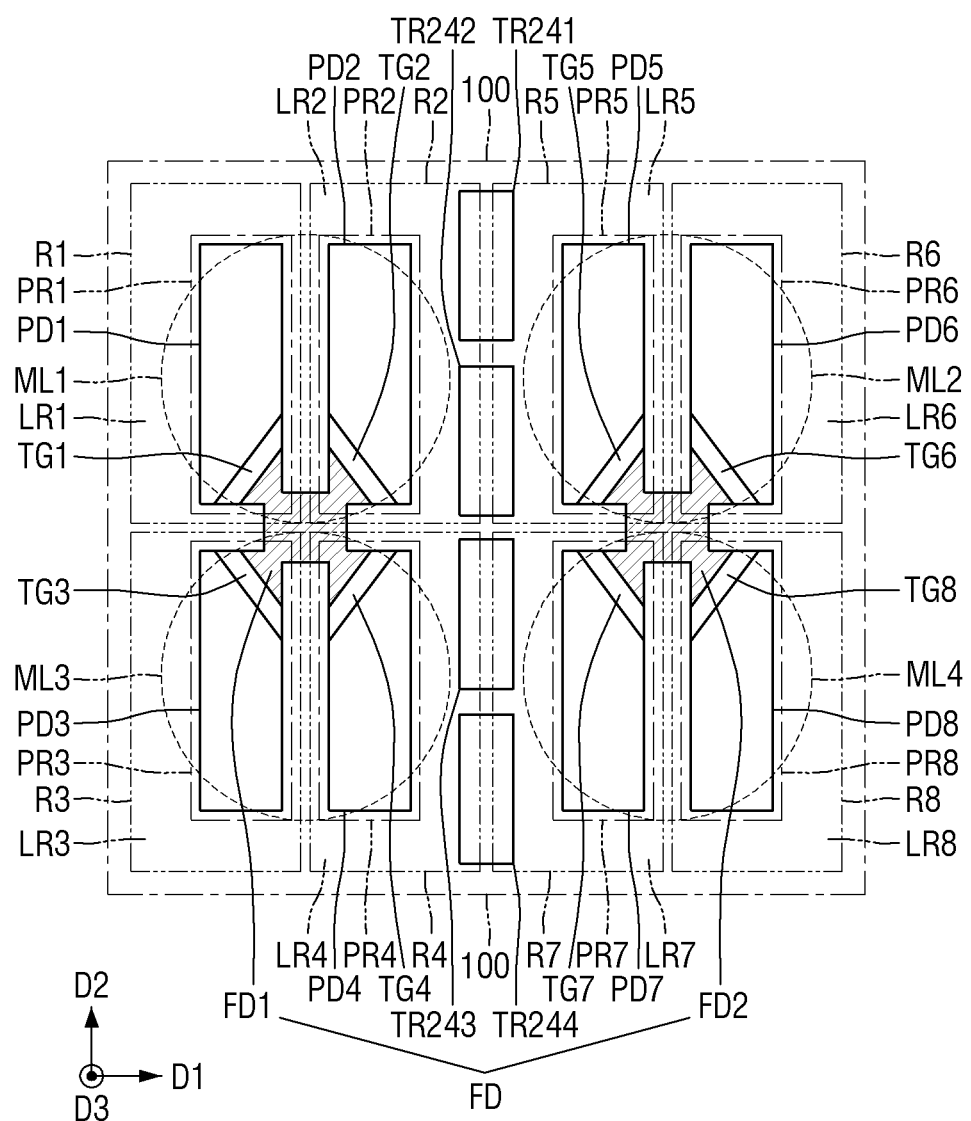
Figure 25:
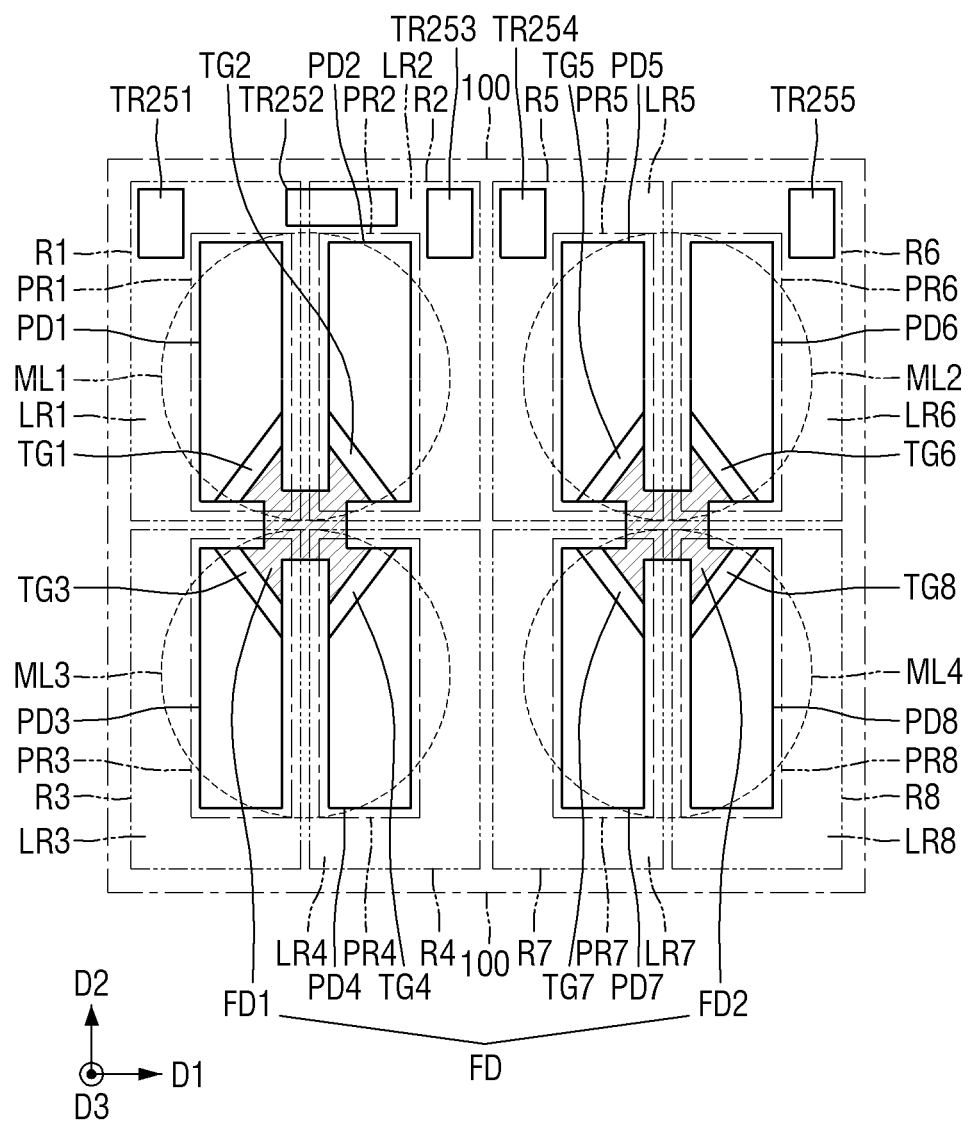

Although FIGS. 22 to 24 illustrate that two pixel transistors are provided for each type, this is only for convenience of description and illustration, and the present inventive concept is not limited thereto. For example, the first pixel transistors may further include a sixth pixel transistor. The sixth pixel transistor may be disposed in any one of the first to eighth pixel regions LR1 to LR8. For example, referring to FIG. 25, the fourth to sixth pixel transistors may be TR251, TR252 and TR253, respectively. Each of the second and third pixel transistors may be one of TR254, 255. In this case, the fourth to sixth pixel transistors may be connected to each other, for example, in parallel or in series.

Figure 26:
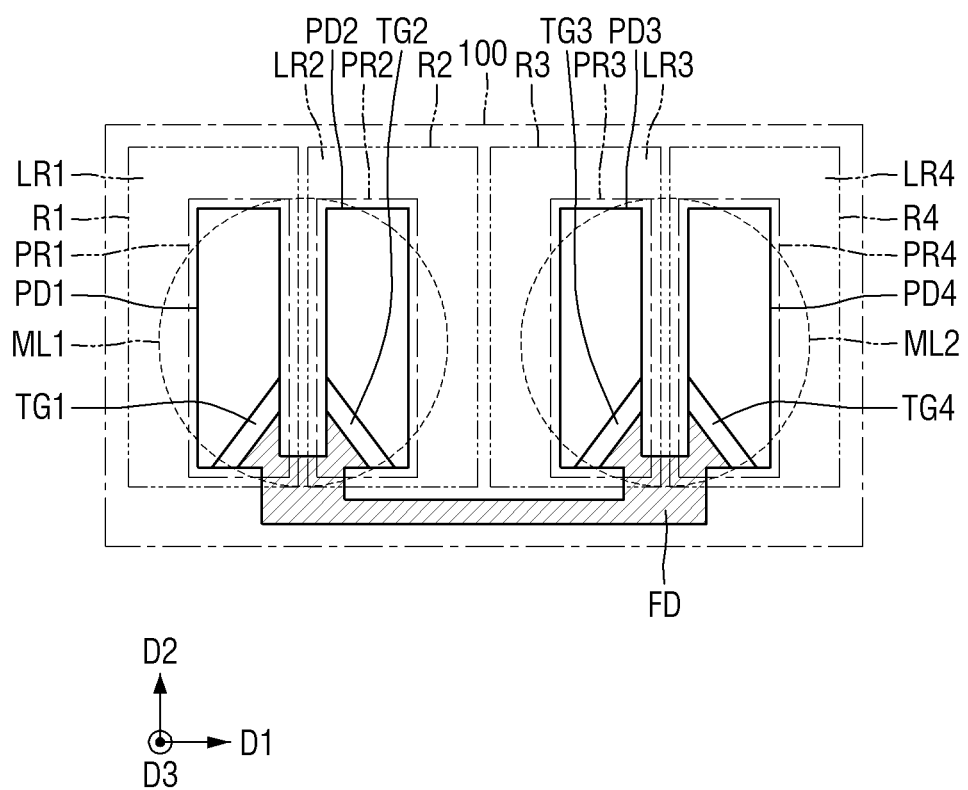
FIG. 26 is an example layout diagram illustrating an image sensor according to some embodiments of the present inventive concept.
Figure 30:
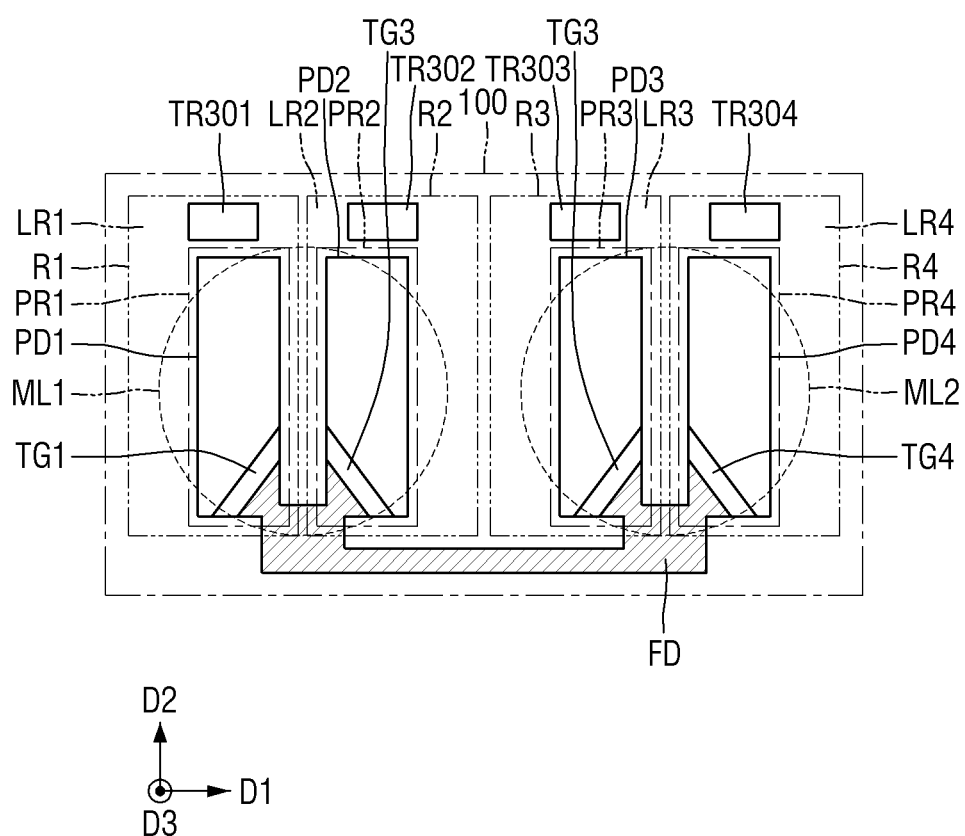
FIGS. 30 and 31 are example layout diagrams illustrating the arrangement of pixel transistors of an image sensor according to some embodiments of the present inventive concept.
Figure 31:
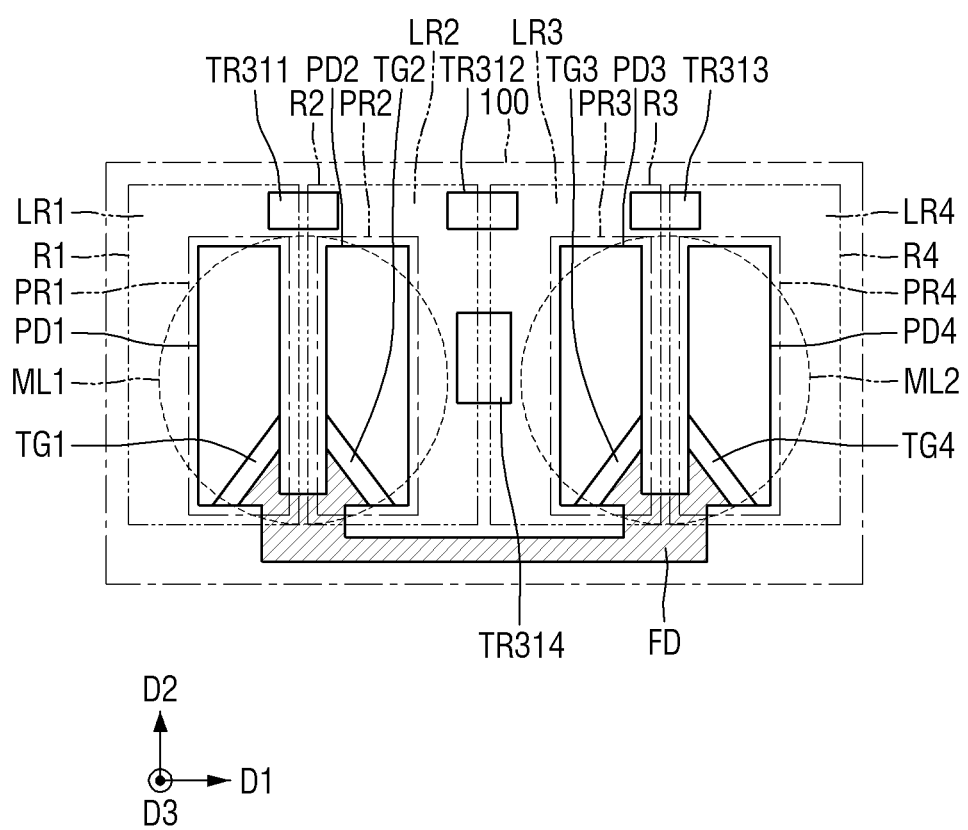

Hereinafter, an image sensor according to some embodiments of the present inventive concept will be described with reference to FIGS. 2 through 6 and FIGS. 26 through 31. For brevity and clarity of explanation, repeated descriptions may be omitted. FIGS. 26, 30 and 31 are views showing a single unit pixel of the sensor array region I of FIG. 2.

Referring to FIGS. 2, 3 and 26, the image sensor according to some embodiments of the present inventive concept may include a unit pixel including first to fourth regions R1 to R4 disposed in the substrate 100. A plurality of unit pixels, each of which includes R1 to R4 of FIG. 26, may be arranged in the sensor array region I of FIG. 2. In this case, the plurality of unit pixels may be repeatedly arranged along the first direction D1 and the second direction D2 in the sensor array region I of FIG. 2.

In some embodiments, the first, second, third and fourth regions R1, R2, R3 and R4 may be arranged in the substrate 100 as illustrated in FIG. 26. The second region R2 may be disposed adjacent to the first region R1 in the first direction D1. The third region R3 may be disposed adjacent to the second region R2 in the first direction D1. The fourth region R4 may be disposed adjacent to the third region R3 in the first direction D1. The components included in the first to fourth regions R1 to R4 in FIG. 26 may be substantially the same as those described with reference to FIG. 3.

The pixel transistors SF, SEL and RG in FIGS. 27 to 29 may be substantially the same as the pixel transistors SF, SEL and RG described with reference to FIGS. 4 to 6.

Figure 27:
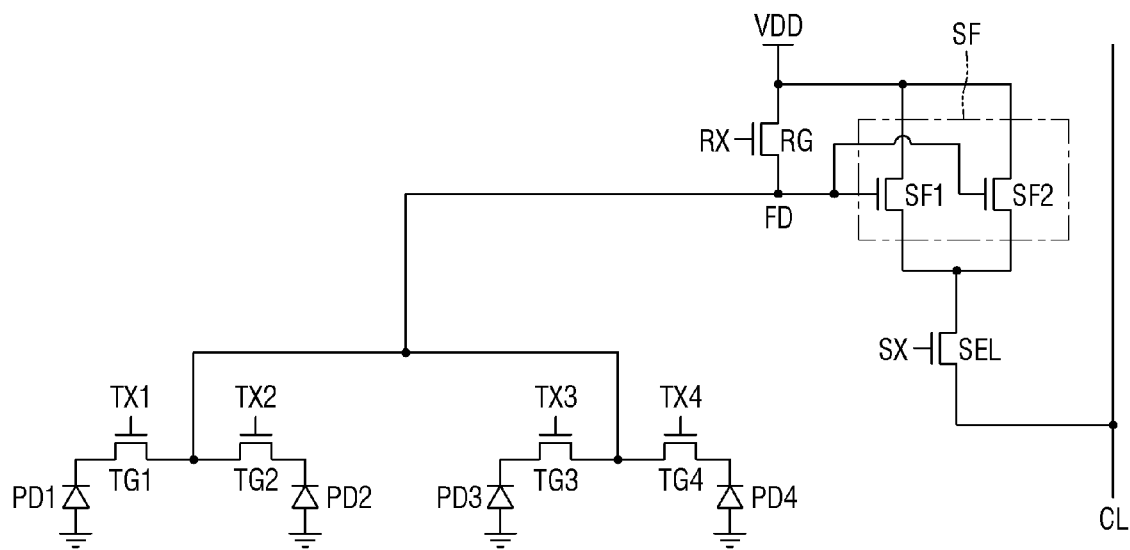
FIGS. 27 to 29 are circuit diagrams of the layout shown in FIG. 26 according to some embodiments of the present inventive concept.

Referring to FIGS. 26 and 27, the image sensor according to some embodiments of the present inventive concept may include first to third pixel transistors SF, RG and SEL.

In some embodiments in which the unit pixel includes the first to fourth regions R1 to R4, the plurality of first pixel transistors may be SF1 and SF2 in FIG. 27 as driving transistors.

Figure 28:
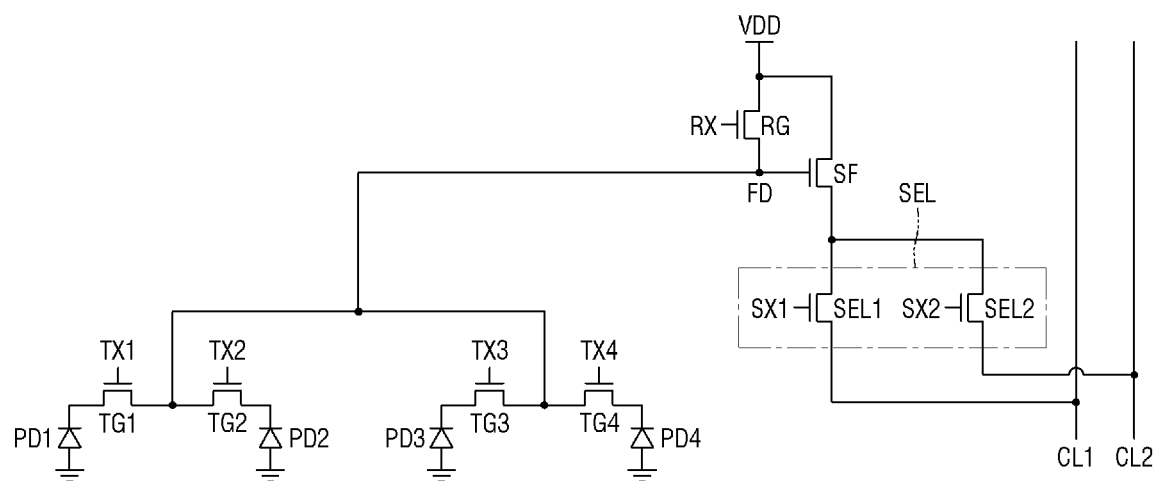

Referring to FIGS. 26 and 28, in some embodiments, the unit pixel including the first to fourth regions R1 to R4 may include selection transistors SEL1 and SEL2 as the plurality of first pixel transistors.

Figure 29:
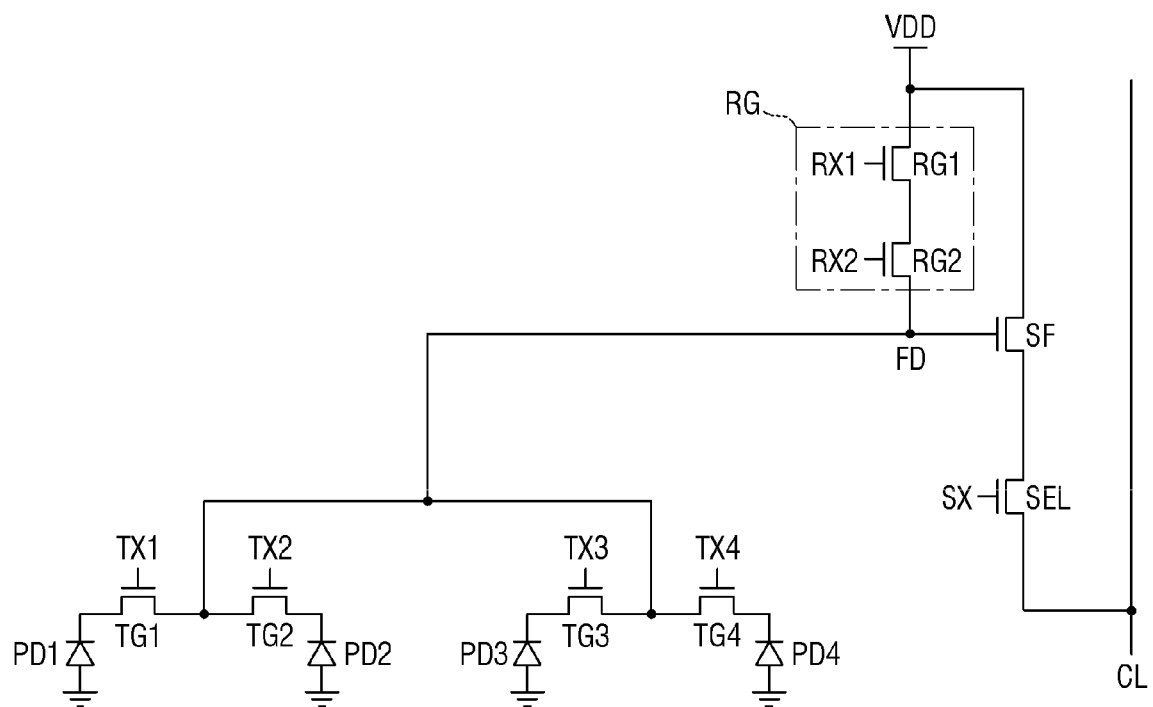

Referring to FIGS. 26 and 29, in some embodiments, the unit pixel including the first to fourth regions R1 to R4 may include reset transistors RG1 and RG2 as the plurality of first pixel transistors.

Referring to FIGS. 26 to 30, the fourth pixel transistor of the plurality of first pixel transistors may be disposed, for example, in either the first pixel region LR1 or the third pixel region LR3. The fifth pixel transistor of the plurality of first pixel transistors may be disposed, for example, in either the second pixel region LR2 or the fourth pixel region LR4. For example, the fourth pixel transistor may be either TR301 or TR303. The fifth pixel transistor may be, for example, either TR302 or TR304.

For example, if the plurality of first pixel transistors are driving transistors SF1 and SF2 as shown in FIG. 27, the fourth pixel transistor SF1 may be TR301, and the fifth pixel transistor SF2 may be TR302. For example, if the plurality of first pixel transistors are selection transistors SEL1 and SEL2 as shown in FIG. 28, the fourth pixel transistor SEL1 may be TR301, and the fifth pixel transistor SEL2 may be TR304. For example, if the plurality of first pixel transistors are reset transistors RG1 and RG2 as shown in FIG. 29, the fourth pixel transistor RG1 may be TR303, and the fifth pixel transistor RG2 may be TR304.

Referring to FIGS. 26 to 29 and 31, the fourth pixel transistor of the plurality of first pixel transistors may be disposed to overlap, for example, a portion of the third pixel region LR3 and a portion of the fourth pixel region LR4. The fifth pixel transistor of the plurality of first pixel transistors may be disposed to overlap, for example, a portion of the first pixel region LR1 and a portion of the second pixel region LR2. In some embodiments, the fifth pixel transistor may be disposed to overlap, for example, a portion of the second pixel region LR2 and a portion of the third pixel region LR3. If the fifth pixel transistor is disposed to overlap a portion of the first pixel region LR1 and a portion of the second pixel region LR2, the fifth pixel transistor may be TR311. In this case, the fourth pixel transistor may be TR313. If the fifth pixel transistor is disposed to overlap a portion of the second pixel region LR2 and a portion of the third pixel region LR3, the fifth pixel transistor may be TR314. In this case, the fourth pixel transistor may be TR313. One of the second and third pixel transistors may be TR312.

For example, if the plurality of first pixel transistors are driving transistors SF1 and SF2 as shown in FIG. 27, the fourth pixel transistor SF1 may be TR313, and the fifth pixel transistor SF2 may be TR311. For example, if the plurality of first pixel transistors are selection transistors SEL1 and SEL2 as shown in FIG. 28, the fourth pixel transistor SEL1 may be TR313, and the fifth pixel transistor SEL2 may be TR311. For example, if the plurality of first pixel transistors are reset transistors RG1 and RG2 as shown in FIG. 29, the fourth pixel transistor RG1 may be TR313, and the fifth pixel transistor RG2 may be TR314.

Figure 32:
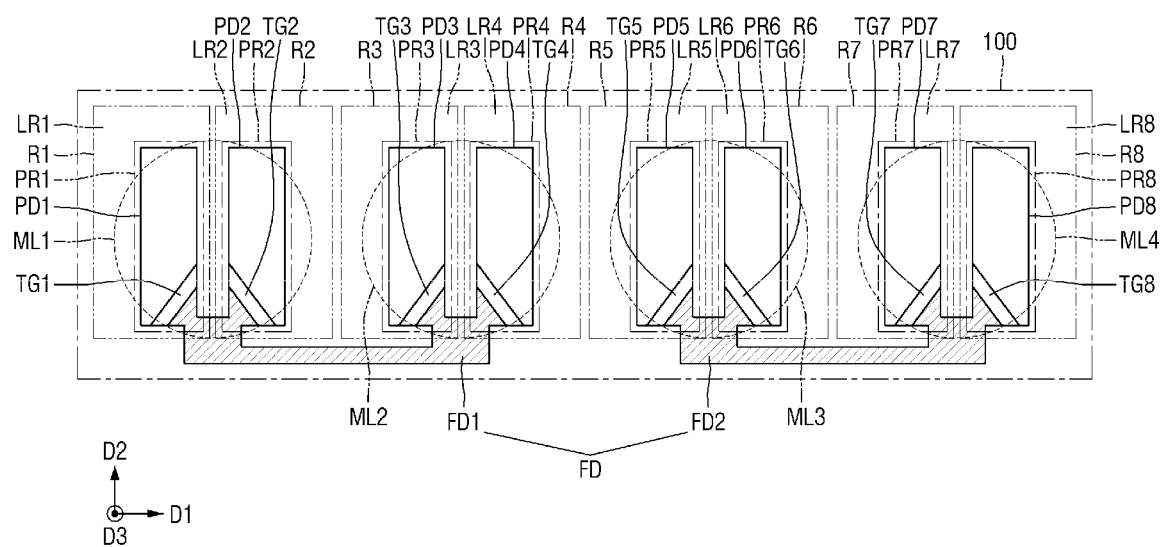
FIG. 32 is an example layout diagram illustrating an image sensor according to some embodiments of the present inventive concept.
Figure 36:
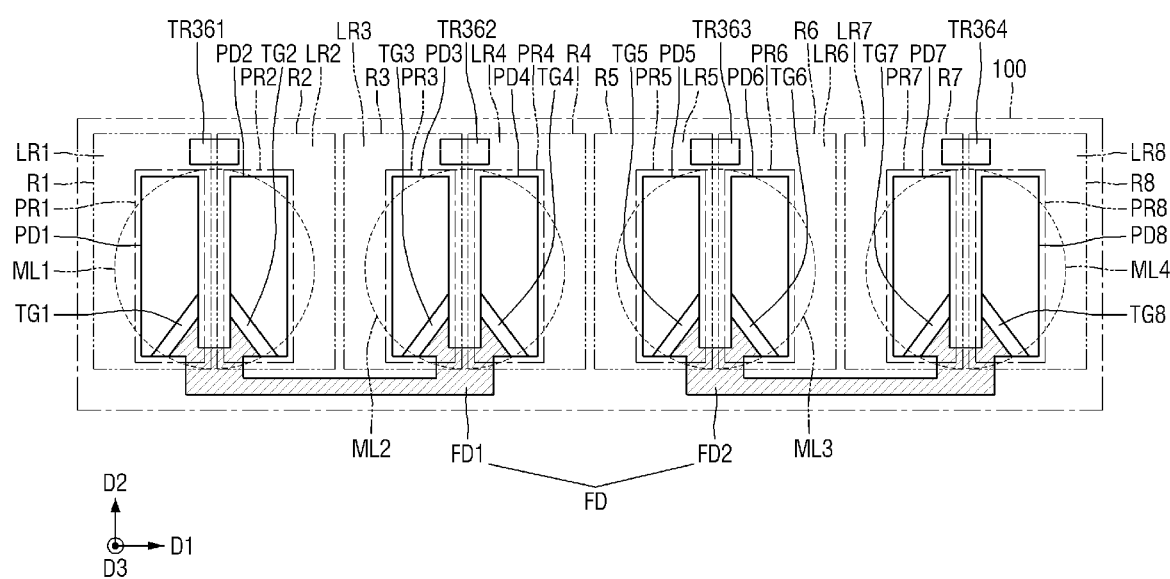
FIGS. 36 and 37 are example layout diagrams illustrating the arrangement of pixel transistors of an image sensor according to some embodiments of the present inventive concept.
Figure 37:
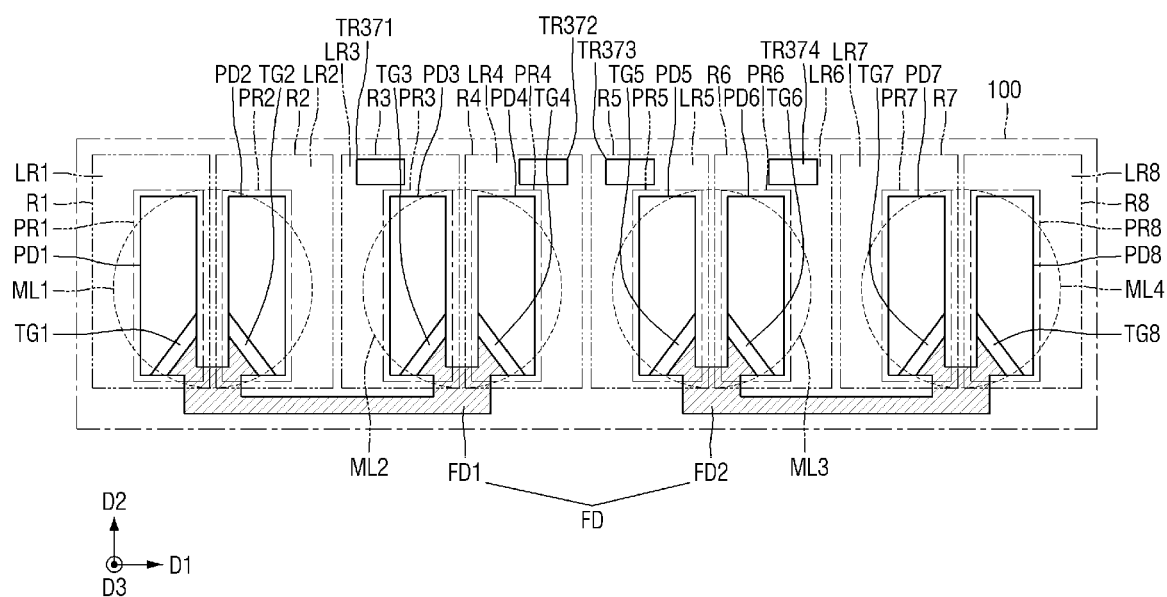

Hereinafter, an image sensor according to some embodiments of the present inventive concept will be described with reference to FIGS. 2 to 6, 10, 26 and 32 to 37. For brevity and clarity of explanation, repeated descriptions may be omitted. FIGS. 32, 36 and 37 are views showing one unit pixel by enlarging a part of the sensor array region I of FIG. 2.

Referring to FIGS. 2, 3, 10, 26 and 32, the first to fourth regions R1 to R4 included in the unit pixel including the first to eight regions R1 to R8 of the image sensor according to some embodiments of the present inventive concept may be substantially the same as those described with reference to FIG. 26.

In some embodiments, the fifth, sixth, seventh, eight regions R5, R6, R7 and R8 may be arranged in the substrate 100 as illustrated in FIG. 32. The fifth region R5 may be disposed adjacent to the fourth region R4 in the first direction D1. The sixth region R6 may be disposed adjacent to the fifth region R5 in the first direction D1. The seventh region R7 may be disposed adjacent to the sixth region R6 in the first direction D1. The eighth region R8 may be disposed adjacent to the seventh region R7 in the first direction D1. The components included in the fifth to eighth regions R5 to R8 may be substantially the same as those described with reference to FIG. 10.

Figure 33:
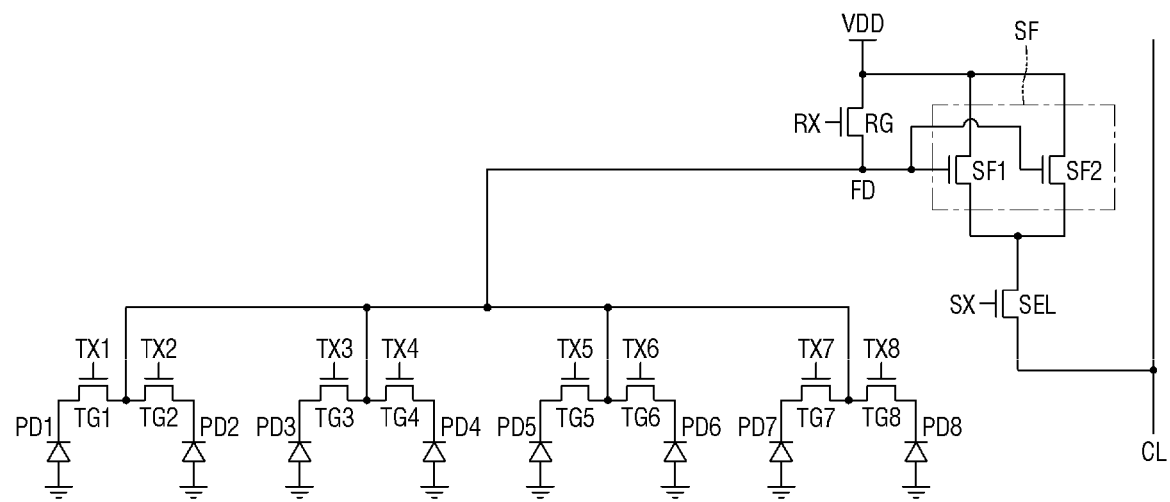
FIGS. 33 to 35 are circuit diagrams of the layout shown in FIG. 32 according to some embodiments of the present inventive concept.

The pixel transistors SF, SEL and RG in FIGS. 33 to 35 may be substantially the same as the pixel transistors SF, SEL and RG described with reference to FIGS. 4 to 6. Referring to FIGS. 32 and 33, the image sensor according to some embodiments of the present inventive concept may include first to third pixel transistors SF, RG and SEL.

In some embodiments, the unit pixel including the first to eighth regions R1 to R8 may include driving transistors SF1 and SF2 as the plurality of first pixel transistors as illustrated in FIG. 33.

Figure 34:
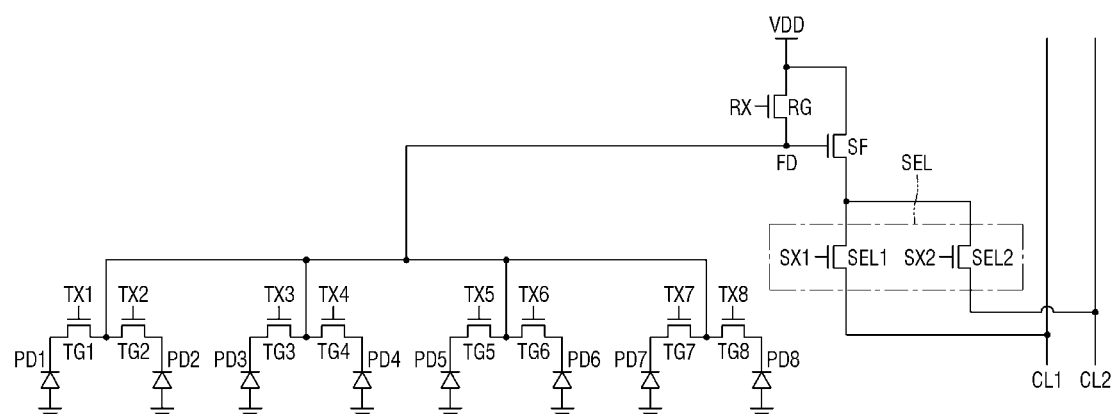

Referring to FIGS. 32 and 34, in some embodiments, the unit pixel including the first to eighth regions R1 to R8 may include selection transistors SEL1 and SEL2 as the plurality of first pixel transistors.

Figure 35:
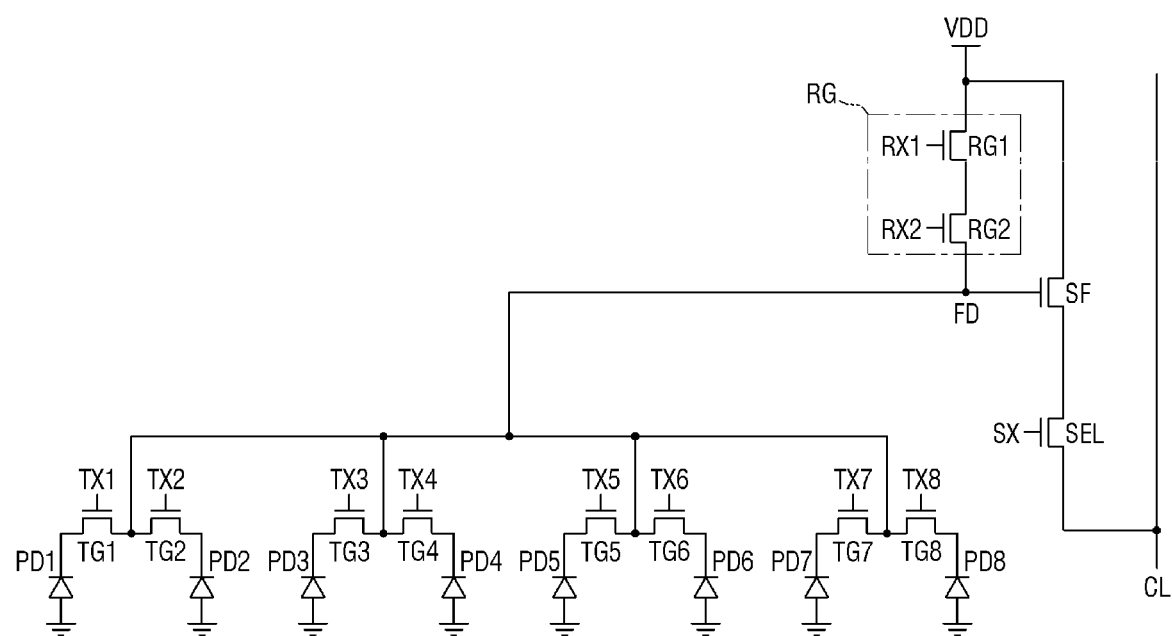

Referring to FIGS. 32 and 35, in some embodiments, the unit pixel including the first to eighth regions R1 to R8 may include reset transistors RG1 and RG2 as the plurality of first pixel transistors.

In some embodiments, the plurality of first pixel transistors may include a fourth pixel transistor and a fifth pixel transistor.

Referring to FIGS. 32 to 36, the fourth pixel transistor may be disposed to overlap, for example, a portion of the first pixel region LR1 and a portion of the second pixel region LR2. The fifth pixel transistor may be disposed to overlap, for example, a portion of the third pixel region LR3 and a portion of the fourth pixel region LR4. For example, the fourth pixel transistor may be TR361. The fifth pixel transistor may be, for example, TR362. For example, if the plurality of first pixel transistors are driving transistors SF1 and SF2 as shown in FIG. 33, the fourth pixel transistor SF1 may be TR361, and the fifth pixel transistor SF2 may be TR362. Each of the second and third pixel transistors may be one of the TR363 and TR364.

Referring to FIGS. 32 to 35 and 37, the fourth pixel transistor may be disposed in either the third pixel region LR3 or the fifth pixel region LR5. The fifth pixel transistor may be disposed in either the sixth pixel region LR6. For example, the fourth pixel transistor may be either TR371 or TR373. The fifth pixel transistor may be TR374. One of the second and third pixel transistors may be TR372.

For example, if the plurality of first pixel transistors are selection transistors as shown in FIG. 34, the fourth pixel transistor SEL1 may be TR371 and the fifth pixel transistor SEL2 may be TR374. For example, if the plurality of first pixel transistors are reset transistors as shown in FIG. 35, the fourth pixel transistor RG1 may be TR373 and the fifth pixel transistor RG2 may be TR374.

Although the arrangement of the first to third pixel transistors SF, RG and SEL has been described with reference to the accompanying drawings, those are examples, and the present inventive concept is not limited thereto. It will be understood that if the first to third pixel transistors SF, RG and SEL are disposed in a plurality of pixel regions LR1 to LR4 included in the unit pixel, various arrangements may be possible.

Although a case where the plurality of first pixel transistors include two or three pixel transistors has been described with reference to the accompanying drawings, the present inventive concept is not limited thereto. For example, it will be understood that the first pixel transistors may include more than four pixel transistors. In addition, in FIGS. 3, 7 to 10, 14 to 18B, 22 to 26, 30 to 32, 36 and 37, the shape of each components is provided for illustration of layout only and may not show shapes of actual components. Accordingly, it will be understood that the present inventive concept is not limited to the shape and the arrangement of the components shown in the drawings.

As used herein the term "and/or" includes any and all combinations of one or more of the associated listed items.

While the present inventive concept has been shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. An image sensor comprising:
    a first photoelectric conversion element group comprising a first photoelectric conversion element, a second photoelectric conversion element, a third photoelectric conversion element, and a fourth photoelectric conversion element;
    a second photoelectric conversion element group comprising a fifth photoelectric conversion element, a sixth photoelectric conversion element, a seventh photoelectric conversion element, and an eighth photoelectric conversion element;
    a first microlens disposed to overlap the first photoelectric conversion element and the second photoelectric conversion element;
    a second microlens disposed to overlap the third photoelectric conversion element and the fourth photoelectric conversion element;
    a third microlens disposed to overlap the fifth photoelectric conversion element and the sixth photoelectric conversion element;
    a fourth microlens disposed to overlap the seventh photoelectric conversion element and the eighth photoelectric conversion element;
    a first floating diffusion region configured to be shared by the first photoelectric conversion element group; and
    a second floating diffusion region configured to be shared by the second photoelectric conversion element group,
    wherein the first photoelectric conversion element group is disposed right next to the second photoelectric conversion element group, and
    wherein the first photoelectric conversion element group and the second photoelectric conversion element group are configured to sense the same color of light received from the first to fourth microlenses.

2. The image sensor of claim 1, wherein the first floating diffusion region is disposed between the first microlens and the second microlens, and
    wherein the second floating diffusion region is disposed between the third microlens and the fourth microlens.

3. The image sensor of claim 1, further comprising eight transfer gates corresponding to first to eight photoelectric conversion elements, respectively.

4. The image sensor of claim 3, wherein the eight transfer gates are connected to a first reset transistor.

5. The image sensor of claim 4, wherein the eight transfer gates are connected to a second reset transistor.

6. The image sensor of claim 5, wherein the first reset transistor and the second reset transistor are connected to each other in series.

7. The image sensor of claim 1, wherein the first floating diffusion region is configured to be connected to the second floating diffusion region.

8. The image sensor of claim 1, wherein the same color is blue.

9. The image sensor of claim 1, wherein the same color is red.

10. The image sensor of claim 1, wherein the same color is green.

11. The image sensor of claim 1, further comprising a color filter shared by the first to eighth photoelectric conversion elements.

12. An image sensor comprising:
    a first shared pixel comprising eight first photoelectric conversion elements connected to a first floating diffusion region, the first shared pixel being configured to sense a first color;
    a second shared pixel comprising eight second photoelectric conversion elements connected to a second floating diffusion region, the second shared pixel being configured to sense a second color;
    a third shared pixel comprising eight third photoelectric conversion elements connected to a third floating diffusion region, the third shared pixel being configured to sense a third color;
    a fourth shared pixel comprising eight fourth photoelectric conversion elements connected to a fourth floating diffusion region, the fourth shared pixel being configured to sense a fourth color; and
    sixteen microlenses disposed to overlap the first to fourth shared pixels,
    wherein the first to fourth shared pixels are sequentially disposed along a clockwise direction.

13. The image sensor of claim 12, wherein each of the sixteen microlenses is disposed to overlap two of eight first photoelectric conversion elements, two of eight second photoelectric conversion elements, two of eight third photoelectric conversion elements, or two of eight fourth photoelectric conversion elements.

14. The image sensor of claim 12, wherein the first color is red.

15. The image sensor of claim 14, wherein the second color is the same as the third color.

16. The image sensor of claim 15, wherein the second color is green, and the fourth color is blue.

17. An image sensor comprising:
    a first shared pixel comprising four first photoelectric conversion elements connected to a first floating diffusion region, the first shared pixel being configured to sense a first color;
    a second shared pixel comprising four second photoelectric conversion elements connected to a second floating diffusion region, the second shared pixel being configured to sense the first color;
    a third shared pixel comprising four third photoelectric conversion elements connected to a third floating diffusion region, the third shared pixel being configured to sense a second color;
    a fourth shared pixel comprising four fourth photoelectric conversion elements connected to a fourth floating diffusion region, the fourth shared pixel being configured to sense the second color; and eight microlenses disposed to overlap the first to fourth shared pixels,
wherein the first to fourth shared pixels are sequentially disposed along a first direction.

18. The image sensor of claim 17, wherein the first color is red, and the second color is blue.

19. The image sensor of claim 17, wherein the first color is green, and the second color is blue.

20. The image sensor of claim 17, wherein the first floating diffusion region is connected to the second floating diffusion region.

* * * * *